(12) United States Patent
Stansfield

(10) Patent No.: US 7,471,643 B2
(45) Date of Patent: Dec. 30, 2008

(54) LOOSELY-BIASED HETEROGENEOUS RECONFIGURABLE ARRAYS

(75) Inventor: Anthony I. Stansfield, Bristol (GB)

(73) Assignee: Panasonic Corporation, Osaka (JP)

( * ) Notice: Subject to any disclaimer, the term of this patent is extended or adjusted under 35 U.S.C. 154(b) by 1565 days.

(21) Appl. No.: 10/188,388

(22) Filed: Jul. 1, 2002

(65) Prior Publication Data

US 2004/0001445 A1 Jan. 1, 2004

(51) Int. Cl.
*H04L 12/28* (2006.01)

(52) U.S. Cl. ............... 370/254; 712/10; 712/11

(58) Field of Classification Search ............ None
See application file for complete search history.

(56) References Cited

U.S. PATENT DOCUMENTS

| | | | |
|---|---|---|---|
| 4,811,214 A | | 3/1989 | Nosenchuck et al. |
| 5,038,386 A | | 8/1991 | Li |
| 5,442,577 A | | 8/1995 | Cohen |
| 5,715,186 A | | 2/1998 | Curtet |
| 5,742,180 A | | 4/1998 | DeHon et al. |
| 5,914,953 A | * | 6/1999 | Krause et al. ............. 370/392 |
| 6,011,795 A | * | 1/2000 | Varghese et al. ........... 370/392 |
| 6,052,773 A | | 4/2000 | DeHon et al. |
| 6,157,967 A | * | 12/2000 | Horst et al. ............... 710/19 |
| 6,469,540 B2 | | 10/2002 | Nakaya |
| 6,609,189 B1 | | 8/2003 | Kuszmaul et al. |
| 6,781,408 B1 | | 8/2004 | Langhammer |
| 6,807,172 B1 | * | 10/2004 | Levenson et al. ........ 370/389 |
| 6,907,011 B1 | * | 6/2005 | Miller et al. ............. 370/254 |
| 6,965,615 B1 | * | 11/2005 | Kerr et al. ............... 370/474 |
| 7,272,691 B2 | * | 9/2007 | Stewart et al. ............ 711/148 |
| 2002/0010902 A1 | * | 1/2002 | Chen et al. ............... 716/16 |
| 2002/0138716 A1 | | 9/2002 | Master |
| 2003/0200418 A1 | * | 10/2003 | DeHon et al. ............. 712/15 |
| 2004/0001445 A1 | | 1/2004 | Stansfield |
| 2004/0027995 A1 | * | 2/2004 | Miller et al. ............. 370/254 |

FOREIGN PATENT DOCUMENTS

WO    WO00/69073 A1    11/2000

(Continued)

OTHER PUBLICATIONS

Bursky, D. "PFGA Combines Multiple Serial Interfaces and Logic" Electronic Design, Penton Publishing, Cleveland, Ohio vol. 28, No. 20, Oct. 2, 2000, pp. 74-76, 78.

(Continued)

*Primary Examiner*—Phirin Sam
(74) *Attorney, Agent, or Firm*—Orrick, Herrington & Sutcliffe LLP

(57) ABSTRACT

A heterogeneous array includes clusters of processing elements. The clusters include a combination of ALUs and multiplexers linked by direct connections and various general-purpose routing networks. The multiplexers are controlled by the ALUs in the same cluster, or alternatively by ALUs in other clusters, via a dedicated multiplexer control network. Components of applications configured onto the array are selectively implemented in either multiplexers or ALUs, as determined by the relative efficiency of implementing the component in one or the other type of processing element, and by the relative availability of the processing element types. Multiplexer control signals are generated from combinations of ALU status signals, and optionally routed to control multiplexers in different clusters.

89 Claims, 11 Drawing Sheets

FOREIGN PATENT DOCUMENTS

WO    WO 2004/075403 A2    9/2004

OTHER PUBLICATIONS

Anthony Stansfield and Ian Page, "The Design of a New FPGA Architecture", 1995, Proceedings of FPL 1995 Conference, pp. 1-14.

"Vertex-II 1.5V Field-Programmable Gate Arrays", Virtex-II Platform FPGA Handbook, Xilinx Inc, v1.0, Dec. 6, 2000, p. 47.

Alan Marshall et al., "A Reconfigurable Arithmetic Array for Multimedia Application", Proceedings of the 1999 ACM/SIGDA 7th International Symposium on FPGA.

Kai Hwang, Advanced Computer Architecture, McGraw Hill, 1993, pp. 338-339.

* cited by examiner

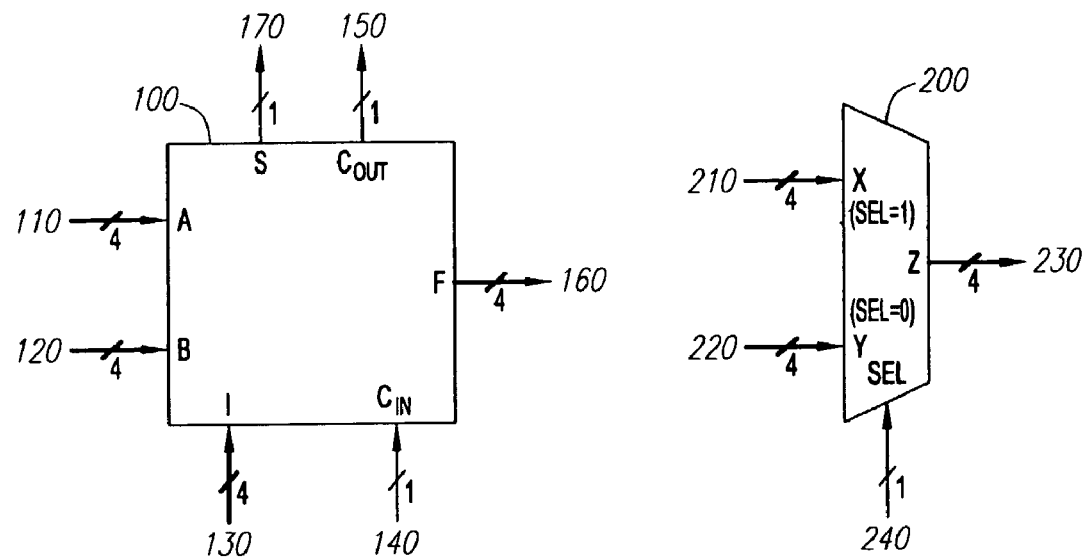
FIG. 1
FIG. 2
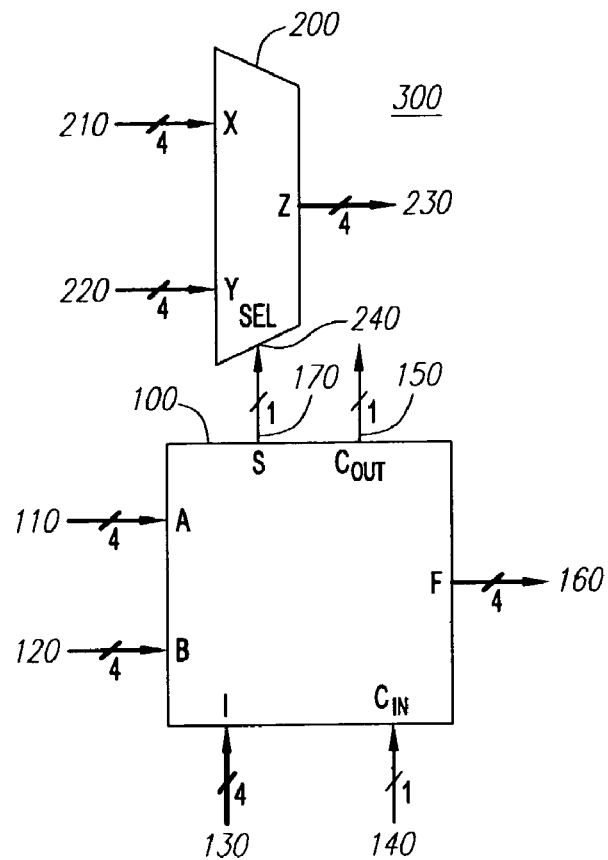
FIG. 3

LOOSELY-BIASED HETEROGENEOUS RECONFIGURABLE ARRAYS

BACKGROUND AND SUMMARY

The invention relates to reconfigurable computing devices. More particularly the invention relates to heterogeneous arrays with array element types capable of implementing multiple aspects of an application.

Reconfigurable devices, such as field programmable gate arrays ("FPGAs"), processor arrays and reconfigurable arithmetic arrays ("RAAs"), normally include a number of processing elements together with an interconnect scheme to connect them together. This interconnect commonly takes the form of a general-purpose routing network, but sometimes other more restrictive forms of interconnect are used. A processing element has one or more data inputs and computes one or more data outputs, each of which is a function that may depend on 2 or more input values—received on 2 or more of the inputs or possibly at separate times on the same input. Examples of processing elements include adders, multipliers, FPGA-like Look-up tables (LUTs), and multiplexers with the select signal capable of being connected to a data input. Processing elements may include registers, so that the output is a function of the values of some or all of the inputs at earlier times.

A general purpose routing network has multiple input terminals and multiple output terminals (and possibly also some bi-directional terminals configurable as either input terminals or output terminals), and can be configured to create a connection between any input terminal and any output terminal. All terminals carry data values of the same wordlength. When configured, a general purpose routing network makes multiple independent connections, each one connecting a network input to one or more network outputs, while each network output is connected to at most one network input. These connections may pass through registers (so that there may be some time offset between network input and network output) but there is no data processing in the routing network, so there is a direct correspondence between a data value at an output terminal and the equivalent value at the relevant input terminal at the relevant time. Such a network is commonly constructed from pass transistors, and/or tristate buffers, and/or statically configured multiplexers (i.e. multiplexers with the select input controlled by the configuration of the array) but regardless of the construction of the network its function remains the same—to propagate data from network inputs to network outputs.

The design of a reconfigurable device is a process of specifying the properties of the processing elements and the interconnect. For both of these elements this involves a series of compromises, discussed below.

The choice of processing element is a compromise between functionality and various parameters such as physical size, operating speed or power dissipation. For example, adding functionality increases the size of each element, but may reduce the total number of elements needed to implement an application. Functionality is only worth adding if the reduction in number of elements outweighs the increase in size of each individual element, so that there is no net increase in application area. Increasing functionality impacts other parameters similarly.

There are various different types of reconfigurable devices, as noted above. There are also various different types of applications for reconfigurable devices. Each of the different types of reconfigurable devices typically perform some types of applications better than others. The assessment of the suitability of a particular processing element used in a reconfigurable device is therefore dependent on the type of applications the device is intended to be used for.

There are several "sweet spots" in the size/functionality space, partly due to partitioning of the application space (e.g. processor arrays are typically used for different types of applications than FPGAs), and partly because a combination of features together may be better than any one of them on their own (e.g. adding a multiplier or a divider to a processor may not be worthwhile, but adding both—with some sharing of hardware between them—is a net benefit).

The interconnect is also a compromise between functionality and various parameters such as physical size, operating speed or power dissipation. The ideal interconnect has zero propagation delay, no risk of one route interfering with another, and a negligible physical area. This ideal does not exist in practice. In reaching a suitable compromise, the properties of various elements can be considered, such as:

The processing elements:
  High-speed processing elements prefer a high-speed interconnect;
  It is beneficial to route data in the same width as the data is processed by the processing elements.
The array:
  The number of possible connections grows as the square of the number of processing elements. The "cost per element" of an interconnect that guarantees no interference between connections therefore increases linearly with the number of processing elements.
  This may be affordable for small arrays, but is not for large ones.
  Propagation delay will tend to increase with the size of the array.
The applications:
  If the applications written for use on the reconfigurable device are written such that the application can be implemented on a device having only nearest-neighbor connectivity, then the interconnect can be greatly simplified. If such simplification is not possible then a general-purpose routing network (as described above) is normally used as the basis of the interconnect, the terminals of the network being the terminals of the processing elements.

To improve performance, a reconfigurable device may also include additional elements such as heterogeneous processing elements, a hierarchical routing network, and/or a heterogeneous interconnect. Heterogeneous processing elements are a combination of two or more different types of processing elements on one device, for example:
  FPGAs with both lookup table based elements and dedicated multiplier blocks;
  FPGAs with both lookup table based elements and product-term based logic; or
  Processor arrays containing both integer and floating-point processors.

Combining processing elements may be done for a variety of reasons, for example to attempt to reduce the "functionality vs. cost" tradeoff problem—if a feature is added as an alternative type of block on a device, then it doesn't add to the cost of all processing elements, just those processing elements that contain the added feature. While superficially attractive this approach has one significant problem—determining what the ratio of different types of processing elements should be and how they should be arranged relative to each other. For example, whether there should be a fine grain mixing of element types: ABABAB . . . or coarser grain mixing: AAABBBAAABBB, such as in a row or column of an array.

The mixing analysis becomes more significant as more different types of processing elements are incorporated into a reconfigurable device.

A hierarchical routing network scheme typically allocates processing elements into groups, with heavy connections within groups, and additional connections between groups (and between groups of groups, etc.). In extensions to this model the groups may overlap—the boundaries are not opaque walls with no connections other than inter-group connections. For instance, processing elements at group boundaries may be members of both groups.

With a heterogeneous interconnect scheme there are two or more types of connections available, for example additional fast but limited interconnect added to complement a slower but more capable general-purpose routing network:

Dedicated wiring may be added to support common connection patterns, e.g. the "Carry wires" in many FPGAs.

There may be dedicated nearest-neighbor connections in addition to a general purpose routing network.

There is a significant difference between "heterogeneous" and "hierarchical" Interconnects—hierarchical routing networks use the same type of connections for all levels of the hierarchy, but vary the reach of the connections from level to level, while heterogeneous interconnects use different types of connections for different networks. Note that an array may contain both heterogeneous and hierarchical interconnects.

Processors typically manage the flow of control within an application with a mixture of conditional and unconditional branches and jumps, and/or predicated execution of instructions. "Reconfigurable computing," defined herein as computing by constructing an application-specific datapath to perform a computation on a reconfigurable device, is not normally so good at managing the control flow.

In processor arrays, while the individual processors are good at managing their own instruction flow they have little or no influence on the other processors in the array.

In FPGA-based reconfigurable computing, every path through the program has to be implemented in the hardware, even those that are not used very often. Given that up to 90% of run-time operations for a processor may be specified in just 10% of the code, this can result in most of the FPGA silicon area being dedicated to infrequently used operations. In the above example, 90% of the area is only used 10% of the time, whereas the remaining 10% of the area is used 90% of the time.

In other devices designed for reconfigurable computing (such as RAA) an attempt is made to improve on the FPGA situation. RAA has arithmetic logic units ("ALUs") with instruction inputs so it is possible to dynamically change the functionality of the datapath by varying the instructions provided to the ALUs. However, this is not a perfect solution.

RAA ALUs process multi-bit words (e.g. 4-bit nibbles) rather than bits, and have a compact instruction encoding (again into 4 bits) to select the operation to perform on the input words. Control conditions, however, tend to be single bits expressing the true/false nature of the decision:

Are the A and B inputs equal?

Is input A greater than input B?

Is bit 3 of an input set to 1?

Processing such single-bit conditions (in statements like "if condition1 or condition2 then ...") with n-bit ALUs makes inefficient use of the ALU datapath—(n−1) of the bits are unused.

This results in a situation where the 1-bit nature of FPGAs makes them good for processing conditions, but poor at branching based on the result of the condition, while multi-bit RAA-like devices are better at branching, but inefficient at processing the conditions.

A useful implementation technique for reconfigurable computing applications is to process data in a bit (or nibble, or some other fraction of the word or other full-width data item) serial form—a single processing element is used in consecutive clock cycles to process consecutive parts of a word. This technique allows area and throughput to be traded off against each other—serialized processing takes longer but uses a smaller number of processing elements.

The ability to transform data between serial and parallel formats is useful in serialized processing. One way of performing this transformation is by using circuits constructed from multiplexers and registers.

Multiplexers are also useful in a reconfigurable device to implement a number of common 1- and 2-input logic functions. These examples are written in terms of the C/java "conditional choice" operator: "a=(b?c:d);" being shorthand for "if (b) then {a=c;} else {a=d;}"

A & B=A?B:0

A|B=A?1:B

NOT A=A?0:1

A^B=A?(NOT B):B

As discussed above, a heterogeneous array provides a mix of processing elements optimized to handle different wordlengths. However conventional heterogeneous arrays suffer from the ratio determining problems discussed above. A useful solution to these problems is to design the first type of processing elements such that they are biased towards multi-bit processing but capable of 1-bit processing, and design the second type of processing elements such that they are biased towards 1-bit processing but capable of multi-bit processing.

BRIEF DESCRIPTION OF THE DRAWINGS

The accompanying drawings are included to provide a further understanding of embodiments of the invention and together with the Detailed Description, serve to explain the principles of the embodiments disclosed.

FIG. 1 depicts an arithmetic logic unit for use in an embodiment of the invention.

FIG. 2 depicts a multiplexer for use in an embodiment of the invention.

FIG. 3 depicts an example of an ALU and a multiplexer combined into a cluster, according to an embodiment of the invention.

DETAILED DESCRIPTION OF THE PREFERRED EMBODIMENTS

An embodiment of the invention will now be disclosed. The array discussed in this embodiment is constructed using ALUs and multiplexers as first and second types of processing elements. Those skilled in the art will appreciate, however, that other processing elements can be used in place of the ALUs, the multiplexers, or both. For example, the array can be constructed using lookup table based elements, product-term based elements, hardwired elements such as dedicated multiplier blocks, floating-point processors, integer processors, or other elements capable of implementing a combinatorial logic function.

The array of this embodiment is described in terms of a plurality of "clusters" of processing elements. A cluster includes a collection of processing elements, including at least one processing element of a first type and one processing element of a second type. The first type and second type processing elements within a cluster are connected to each other with direct intra-cluster connections, which may be wires, busses, or other forms of electrical connections. The intra-cluster connections are not part of any general-purpose routing network present on the array. There may, however, be a connection with the general-purpose routing network at a cluster boundary. A cluster is defined as a set of processing elements that are connected directly or indirectly by the complete set of connections that directly connect non-identical elements. For embodiments with two types of processing elements, any of the processing elements within a cluster can be reached from any other processing element in the cluster by following the intra-cluster connections between first type and second type processing elements or vice versa, without regard to the direction that signals actually travel over the intra-cluster connections. For embodiments which have three types of processing elements, any path of intra-cluster connections connecting non-identical types of processing elements defines a cluster.

For example, where the first type of processing elements are ALUs and the second type of processing elements are multiplexers, the path ALU-MUX-ALU-MUX describes a cluster, but the path ALU-MUX-MUX does not, since there is a connection between two processing elements of the same type in the path. Similarly, for three processing element types A, B, C, a path A-B-C-A describes a cluster, but A-B-B-C-A does not, because of the B-B connection.

A cluster may also include connections between processing elements of the same type, as long as there exists a path between each pair of processing elements in the cluster as described above.

Figure 19:
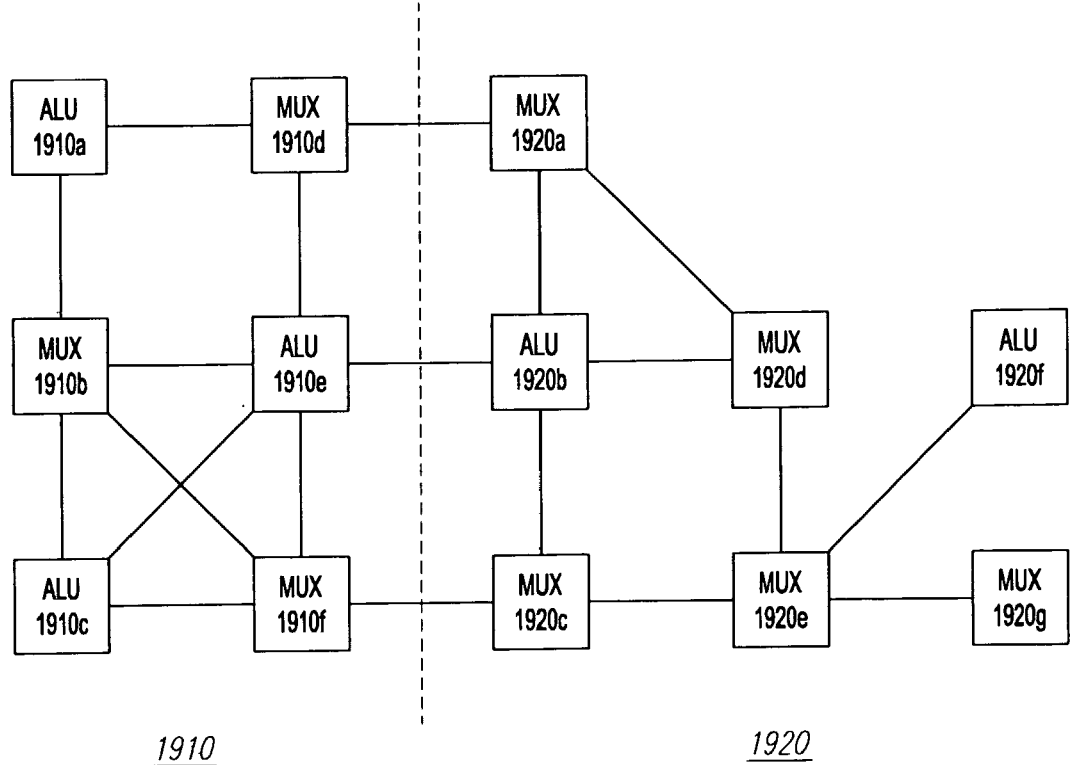
FIG. 19 depicts a collection of ALUs and multiplexers arranged into clusters.

FIG. 19 depicts an example of clusters. The processing elements are designated by the "ALU" and "MUX" elements, and the connections are designated by the lines connecting elements. The first cluster 1910 includes all of the processing elements 1910(a)-(f), on the left side of the dashed line. The second cluster 1920 includes all of the processing elements 1920(a)-(g), on the right side of the dashed line. Each processing element 1910(a)-(f) can be reached from each other processing element 1910(a)-(f) by following a series of ALU-MUX or MUX-ALU connections. Similarly, each processing element 1920(a)-(g) can be reached from each other processing element 1920(a)-(g) by following a series of ALU-MUX or MUX-ALU connections. No processing element 1910(a)-(g) can be reached from a processing element 1920(a)-(g) by following ALU-MUX or MUX-ALU connections. At least one ALU-ALU or MUX-MUX connection must be followed. Therefore, the processing elements 1910(a)-(f) are not members of the second cluster 1920, and the processing elements 1920(a)-(g) are not members of the first cluster 1910.

An "ALU" is a processing element which is configurable to implement various mathematic and logic functions, depending on an instruction value. The ALU receives one or more data inputs, and applies the function selected by the instruction value to the data inputs, generating a data output. The ALU may also receive a carry-in value from another processing element, and depending on the data and instruction values received, may provide a carry-out output value to another processing element.

A "multiplexer" is a processing element which receives two or more data input values and provides one of the data input values to a data output, based on a select input value.

Turning to FIG. 1, an ALU 100 for use in a reconfigurable array includes a first data input 110, a second data input 120, and an instruction input 130. The data and instruction inputs receive input values from other elements within the array, or from elements connected to the array. The data and instruction inputs receive input values of a first bit width.

The ALU 100 also includes a carry-in input 140 ("$C_{in}$"), which is of a second bit width. This input is used to receive a carry input from another ALU 100 in the array.

The ALU 100 also includes a carry-out output 150 ("$C_{out}$"), which is also of the second bit width. The carry-out output 150 provides a carry output to other elements within the array or to other elements connected to the array. Depending on the configuration of the ALU 100, the carry-in input 140 and the carry-out output 150 can provide values other than carry values, as desired by the designer.

The ALU 100 also includes a data output 160, of the first bit width. The data output 160 provides the result of the mathematic or logical function performed by the ALU to other elements within the array, or to other elements connected to the array.

The ALU 100 also includes a select signal output 170, of the second bit width. The select signal output 170 provides a select signal to other elements within the array or to other elements connected to the array. The select signal may be any of a wide variety of signals useful to control the functioning of another element within the array or connected to the array. For example, the select signal may be one or more of the following data-dependent signals:

$C_{out}$: The carry out from an ALU operation,

Sign: The correct sign of an ALU operation (even in the event of an arithmetic overflow), Overflow: A signal indicating that there has been an arithmetic overflow.

Alternatively, it could be one or more of the bits of the instruction input 130. This allows for both data-dependent and instruction dependent signals to be provided. In some embodiments, the ALU 100 is adapted to store an internal instruction independent of the instruction input 130. This allows the instruction input 130 to be used as a dedicated select signal input, by providing part or all of the instruction input 130 directly to the select signal output 170, while using the stored instruction value to control the ALU 100. The select signal output 170 may also include additional circuitry to select various signals routed from the ALU 100, as discussed in further detail below.

Turning to FIG. 2, a multiplexer 200 for use in the reconfigurable array includes a first input 210 and a second input 220, both of the first bit width. The inputs 210, 220 receive input values from other elements within the array, or from elements connected to the array.

The multiplexer 200 also includes an output 230, of the first bit width. The output 230 provides the results of the input selection performed by the multiplexer 200 to other elements within the array, or to elements connected to the array.

The multiplexer 200 also includes a select input 240. The select input 240 receives a selection value that indicates which of the inputs 210, 220 is to be directed to the output 230. The select input 240 is of the second bit width. In this embodiment, a selection value of "1" results in the first input 210 being directed to the output 230, and a selection value of "0" results in the second input 220 being directed to the output 230.

In this embodiment, the first bit width is word-wide, being four bits wide and the second bit width is one bit wide. In other embodiments, the first bit width and second bit width can be any size, as desired by the particular implementation contemplated by the designer. The inputs and outputs of the first bit width are preferably connected to a first general-purpose routing network, useful to route signals across the various elements of the array. The inputs and outputs of the second bit width are preferably connected either directly to another processing element or else connected to a second general purpose routing network adapted to carry signals of the second bit width. In either case, the second bit width signals bypass the first general-purpose routing network. Alternatively, the second bit width signals are routed across the first general-purpose routing network, along with the first bit width signals. The various inputs and outputs can be connected using various wires, busses, or other electrically conductive devices or current paths.

Turning to FIG. 3, a cluster 300 includes an ALU 100 and a multiplexer 200. The select output 170 of the ALU 100 provides a select signal to the select input 240 of the multiplexer 200. As discussed above, the multiplexer 200 can be controlled by either a data-dependent or an instruction-dependent signal. In terms of their usefulness in an application, these two cases are broadly equivalent to conditional and unconditional branching in a processor.

Additional multiplexers can be added to the cluster 300, as desired by the designer. These additional multiplexers may be controlled by the same select signal as controls the multiplexer 200, or they may be controlled by different select signals. The cluster 300 may also be extended by the addition of other elements, such as additional ALUs, registers, gates, etc., attached to the various inputs and outputs of the elements within the cluster 300. A cluster 300 may also be connected to other clusters, to implement more complex circuits. Various examples of such extensions are discussed in more detail below.

Figure 4A:
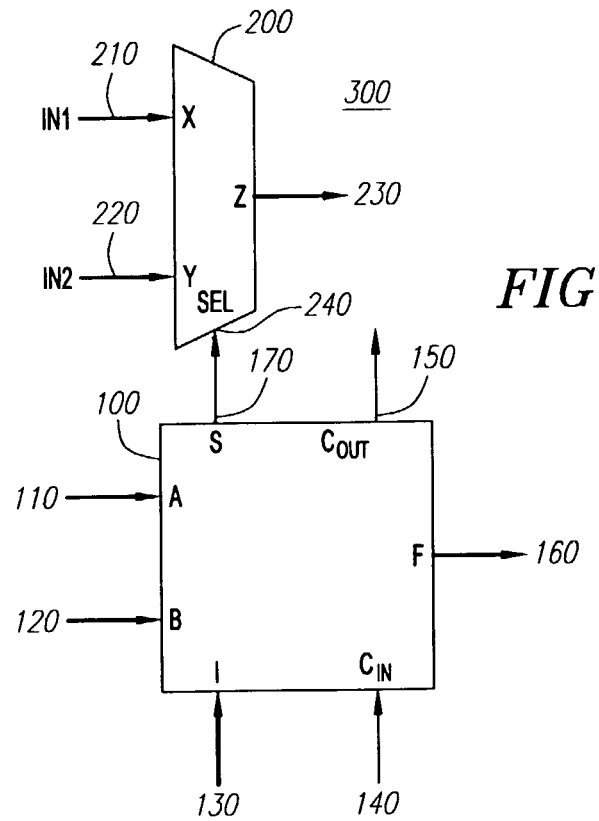
FIG. 4A depicts a cluster configured as a data selection circuit.
Figure 4B:
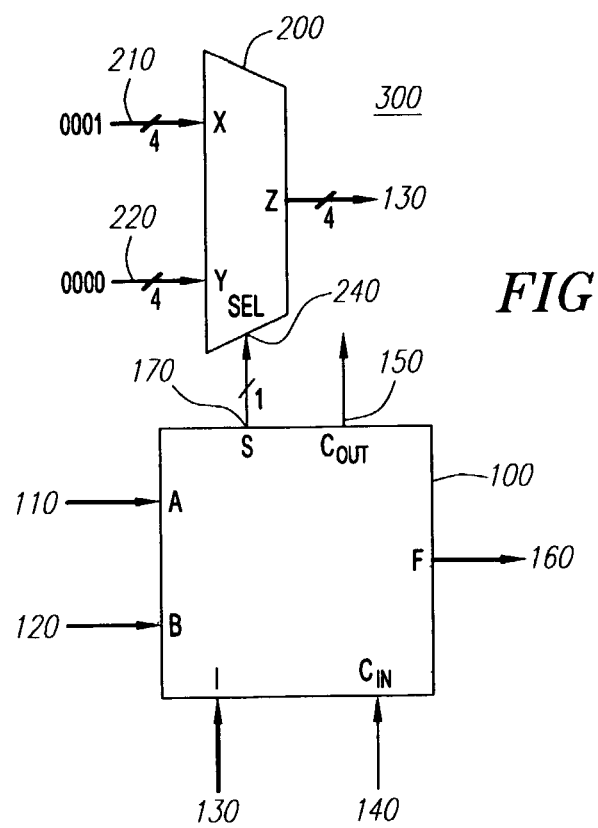
FIG. 4B depicts a cluster configured as a data propagation circuit.
Figure 5:
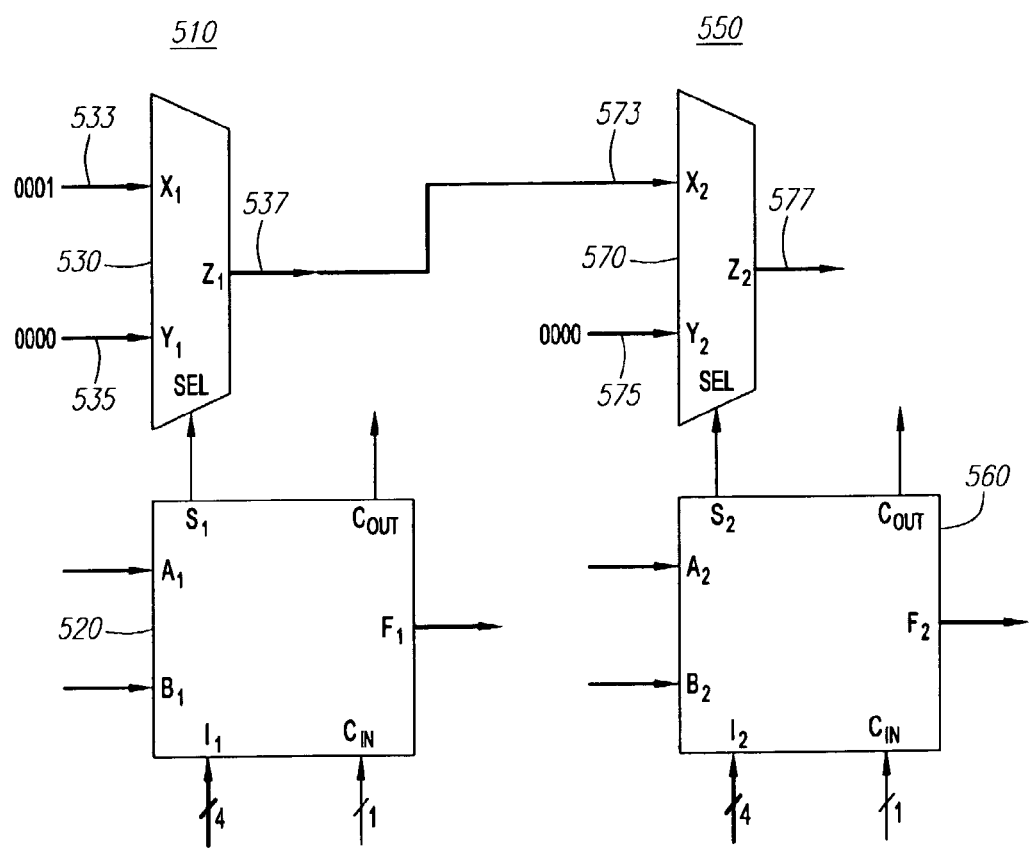
FIG. 5 depicts two clusters configured as a condition processing circuit.
Figure 6:
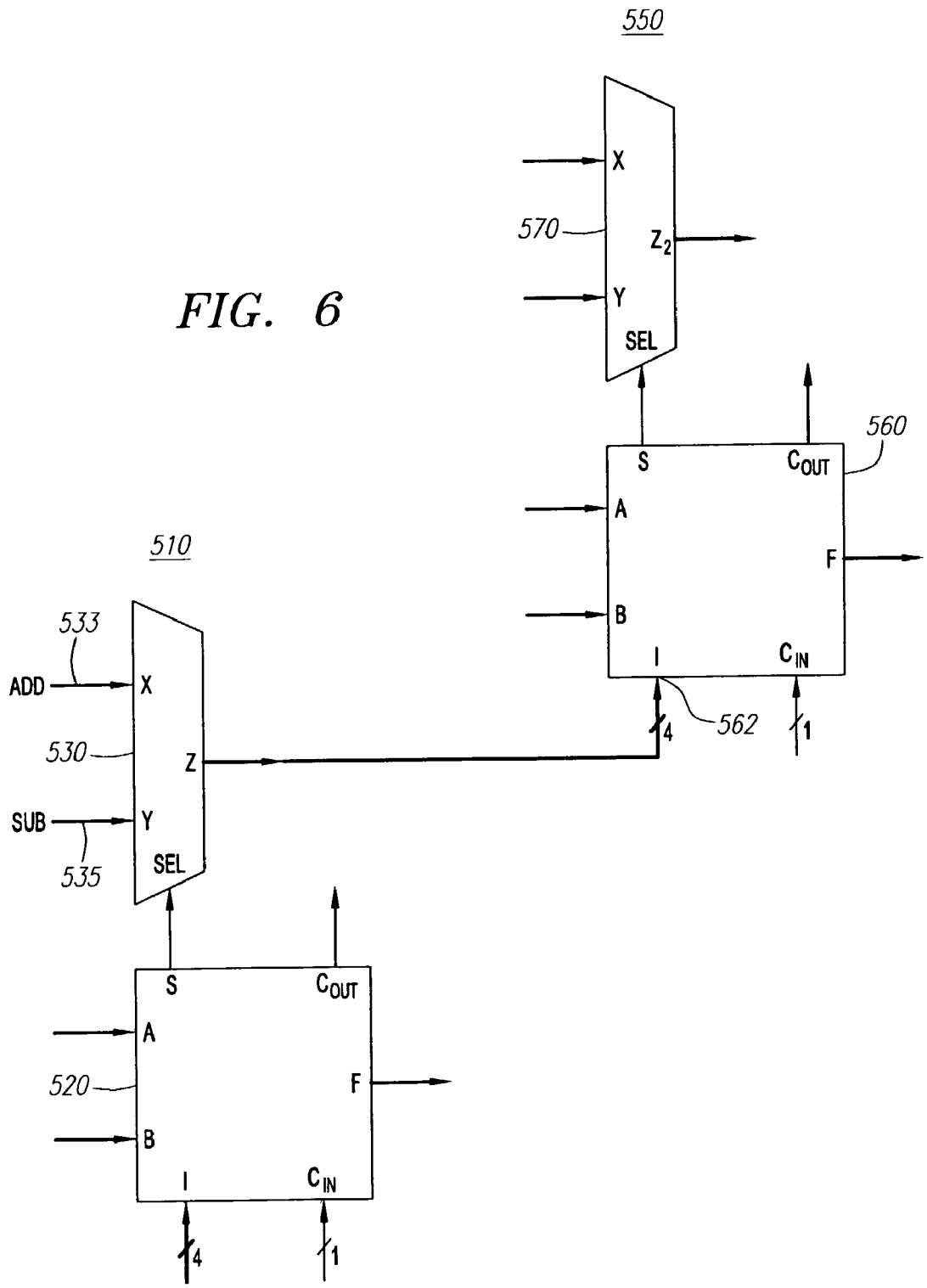
FIG. 6 depicts two clusters configured as a datapath control circuit.

The cluster 300 can be used alone or in combination with other clusters 300 to implement a wide variety of circuits, examples of which are provided in FIGS. 4-6. Turning to FIG. 4A, a cluster 300 is used to implement a data selection circuit. The data selection circuit selects either "in1" or "in2" depending on the result of the condition provided on the select signal output 170. For example, if the select signal output 170 is configured to provide an overflow signal, then the data selection circuit will select "in1" if there is an overflow (S=1), and "in2" if there is no overflow (S=0).

This circuit is useful in formatting data, for example by performing sign extension when the word length is changed. The first input 110 carries a signed 4-bit value A, to be converted to an 8-bit value. The multiplexer inputs 210, 220 carry the values "1111" and "0000" respectively. The ALU 100 evaluates the function A<0, to generate the proper sign signal in the select output 170 and to propagate the input value A to the ALU output 160. The sign output signal is used to switch the multiplexer 200 to select either "1111" or "0000". The 8-bit result is constructed from the value on the ALU output 160, and the value on the multiplexer output 230.

Turning to FIG. 4B, the cluster 300 can also be configured to propagate a second bit width signal generated by the ALU 100 onto the first bit width general-purpose routing network. The second bit width select signal generated on the select output 170 of the ALU 100 is routed to the select input 240 of the multiplexer 200. The first input 210 is provided with a value "0001", which is a first bit width representation of the second bit width value "1". The second input 220 is provided with a value "0000", which is a first bit width representation of the second bit width value "0". When the select signal is "1", the multiplexer 200 causes the first input value 210 of "0001" to be routed to the output 230, and from there onwards to the general-purpose routing network. Similarly, when the select signal is "0", the multiplexer 200 causes the second input value 220 of "0000" to be routed to the output 230, and from there onwards to the first general-purpose routing network. Thus the select signals such as sign, overflow, carry out, etc, are efficiently converted from the second bit width to the first bit width and placed on the first general-purpose routing network, where they can be sent onwards to other processing elements. This provides an alternate path for these signals, in addition to the dedicated connections and second general purpose routing network discussed above.

Turning to FIG. 5, a first cluster 510 and a second cluster 550 are used to implement a condition processing circuit. The condition processing circuit performs a logical operation on one or more conditions provided as select output values of the ALUs. The first cluster 510 includes a first ALU 520 which generates a first condition (e.g. "sign" of the output value $F_1$), and passes the first condition to a first multiplexer 530. The first multiplexer 530 receives a constant value of "0001" on the first input 533, and a constant value of "0000" on the second input 535. If the first condition is "1", then the first multiplexer 530 selects the first input 533 to provide to the output 537, otherwise the first multiplexer 530 selects the second input 535 to provide to the output 537.

The second cluster 550 includes a second ALU 560 which generates a second condition (e.g. "sign" of the output value $F_2$), and passes the second condition to a second multiplexer 570. The second multiplexer receives the value from the output 537 on the first input 573, and a constant value of "0000" on the second input 575. If the second condition is "1", then the second multiplexer 570 selects the first input 573 to provide to the output 577, otherwise the second multiplexer 570 selects the second input 575 to provide to the output 577.

The outputs of this circuit, expressed as a function of the first condition and the second condition, is shown in Table 1 below:

TABLE 1

| $S_1$ | $Z_1 = X_2$ | $S_2$ | Output |
|---|---|---|---|
| 0 | 0000 | 0 | 0000 |
| 0 | 0000 | 1 | $X_2 = 0000$ |
| 1 | 0001 | 0 | 0000 |
| 1 | 0001 | 1 | $X_2 = 0001$ |

As can be seen from Table 1, the condition processing circuit of FIG. 5 produces as an output the logical AND of the two conditions $S_1$ and $S_2$. Other logic functions can be similarly generated.

Turning to FIG. 6, the first cluster 510 and the second cluster 550 are configured to implement a datapath control circuit. The first ALU 520 generates a select signal as discussed above and sends the select signal to the first multiplexer 530. The first multiplexer 530 receives a data input signal corresponding to an addition ("ADD") instruction value on the first input 533, and a data input signal corresponding to a subtraction ("SUB") instruction value on the second input 535. These data inputs will typically be multi-bit signals, as discussed above. Based on the value of the select signal, the first multiplexer 530 routes either the ADD or the SUB instruction value to the instruction input 562 of the second ALU 560. The output of the second ALU 560 is therefore either $A_2+B_2$ or $A_2-B_2$, depending on the condition generated by the first ALU 520. Thus, a datapath within the array containing the first and second clusters 510, 550 is controlled by altering the function performed by the second ALU 560. Any desired datapath control function can be implemented by varying the data and instruction inputs to the first ALU 520 and first multiplexer 530.

Figure 7:
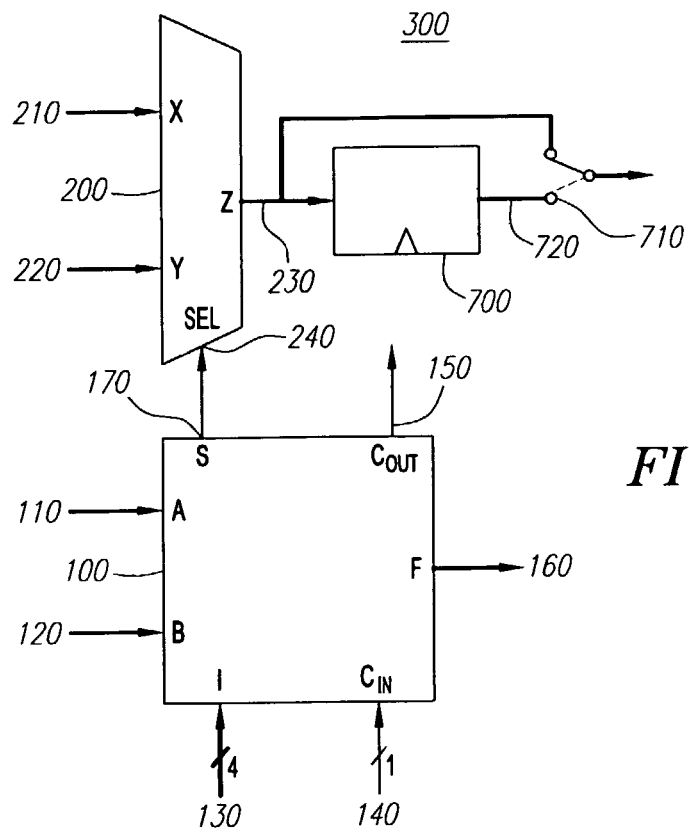
FIG. 7 depicts a cluster with an output register connected to the multiplexer.

Turning to FIGS. 7-8, an output register can be added to the cluster 300 to create additional useful circuits. These circuits are useful for performing data formatting for serial-to-parallel and parallel-to-serial conversion of data. The circuit of FIG. 7 includes the ALU 100 and multiplexer 200 as discussed above. Additionally, there is a register 700 attached to the output 230 of the multiplexer 200. The register 700 stores a value loaded in from the output 230 of the multiplexer 200. A switch 710 is adapted to route either the multiplexer output 230 or the register output 720 onwards to other elements. The switch 710 is set as part of the configuration of the application onto the array. In an alternate embodiment, there is a second register connected to the output 160 of the ALU 100, either with or without a corresponding switch.

Figures 8A, 8B:
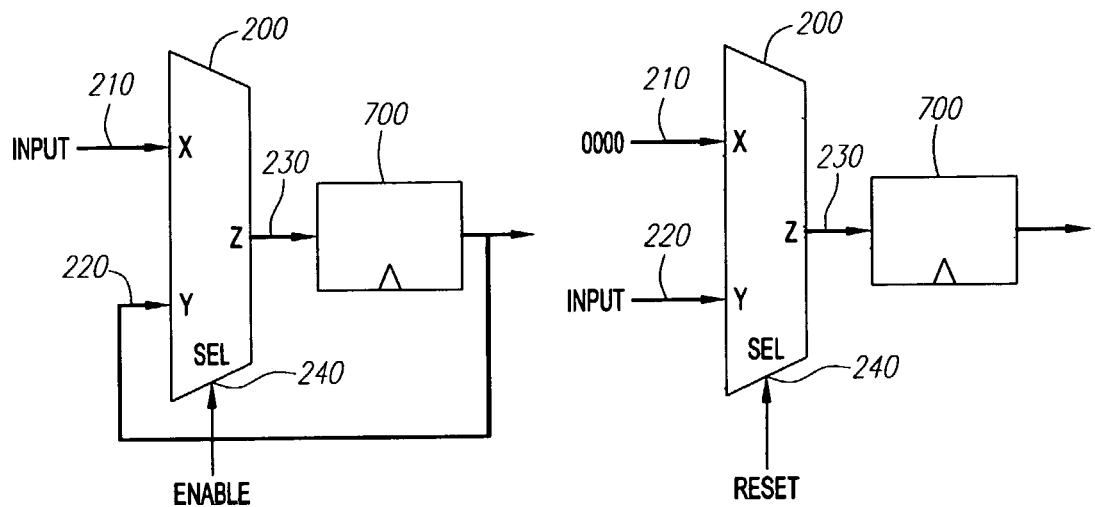
FIG. 8A depicts a register with enable configuration for a multiplexer with register.
FIG. 8B depicts a register with reset configuration for a multiplexer with register.

FIGS. 8A and 8B show implementations of useful register circuits that can be implemented using the cluster 300. FIG. 8A is an implementation of a "register with enable" circuit, and FIG. 8B is an implementation of a "register with reset" circuit. The "register with enable" circuit of FIG. 8A provides a register where the register contents only update (with the "input" value) when "enable" is active on a clock edge, otherwise the stored value is recycled and the output is unchanged. The "register with reset" circuit of FIG. 8B provides the value "input" to the register as long as the reset signal is inactive. When the reset signal goes active, then a zero value is loaded into the register on the next clock edge. Both of these register options are commonly used in applications, and thus these circuits are useful in implementing applications on a reconfigurable array and can be easily constructed with the "multiplexer and register" arrangement of FIG. 7.

Many of the possible uses of multiplexers involve having a constant value on one or both of the inputs to the multiplexer, e.g.:

Implementing an AND, OR or NOT gate,
Propagating a carry out value to the first general purpose routing network, or
Implementing a resettable register.

Figure 9:
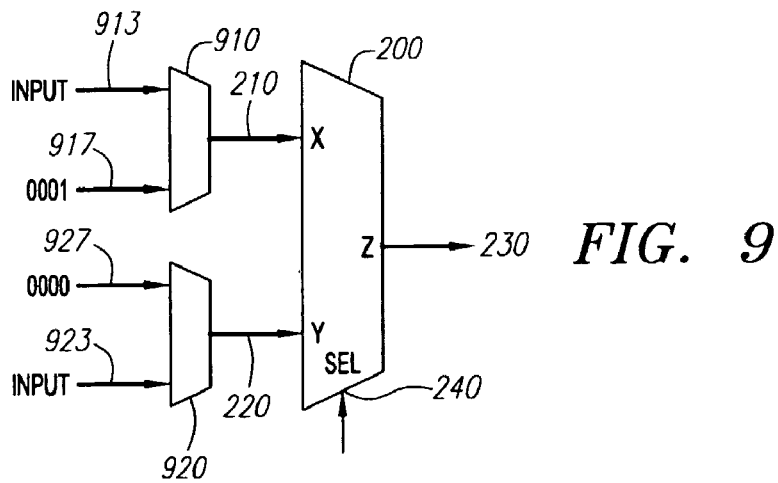
FIG. 9 depicts a multiplexer with additional input selection logic.

These uses are facilitated by adding input selection logic to the inputs of the multiplexer 200. The input selection logic is a trade-off which increases the size of the multiplexers but reduces the number of signals that are propagated through the routing networks. The multiplexer 200, as shown in FIG. 9, has a first input multiplexer 910 and a second input multiplexer 920 attached to the first input 210 and second input 220 respectively. The first input multiplexer 910 is adapted to provide either a first input value 913 or a first constant value 917 (here the value "0001") to the first input 210. The second input multiplexer 920 is adapted to provide either a second input value 923 or a second constant value 927 (here the value "0000") to the second input 220. The input multiplexers 910, 920 are not intended to be controlled dynamically by the application. The control signals for the input multiplexers 910, 920 are set when the application is loaded into the array, and do not vary thereafter. In an alternate embodiment where a higher level of control over the array is desired, the input multiplexers 910, 920 are dynamically controllable.

The input multiplexers 910, 920 may be extended to include other signals, either constant or variable. For example, turning to FIG. 10, the second input multiplexer 920 is extended by adding the feedback signal as an input to the second input multiplexer 920. Thus the second input multiplexer 920 can be configured to form a feedback path 1010 to the second input 220, in order to implement the "register with enable" circuit of FIG. 8A. Similarly, turning to FIG. 11, the first input multiplexer 910 is extended by providing the carry out signal from the carry out output 150 of the ALU 100 to the first input multiplexer 910. If the inputs to the first input multiplexer 910 are wider than the carry out output 150, then the carry out signal is padded with leading zeros. Thus for example a carry out signal of "1" is padded to "0001" when provided to the first input multiplexer 910. Thus, when properly configured, the first input multiplexer 910 provides the carry out output 150 to the multiplexer 200, via the first input 210. This provides another route to provide the carry out signal to the first general-purpose routing network. Although the carry out signal is already available to the multiplexer 200 via the select input 170, and thus can be propagated to the first general-purpose routing network that way, this modification makes it possible to create a carry register with enable (or reset by modifying the circuit of FIG. 8B) in one multiplexer 200 and one register 700 (not taking into consideration any input multiplexers that may be present). A resettable carry output register is useful in serial arithmetic applications.

Figure 11:
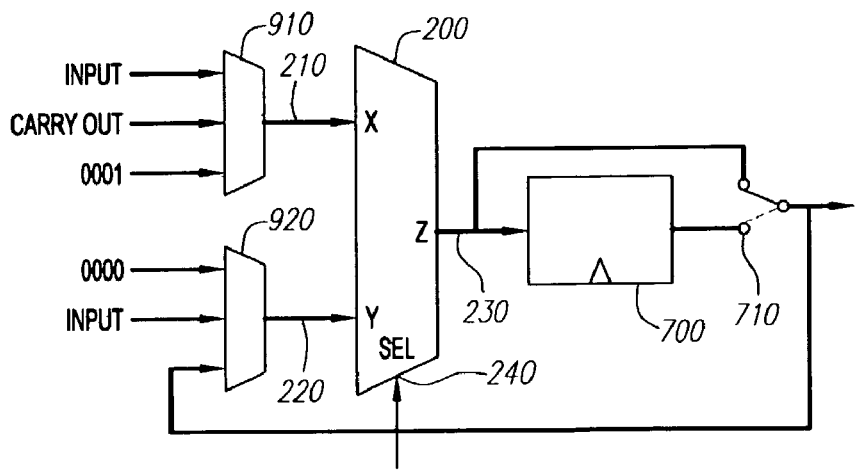
FIG. 11 depicts a multiplexer configured to provide an alternate route for a carry-out signal.
Figure 12:
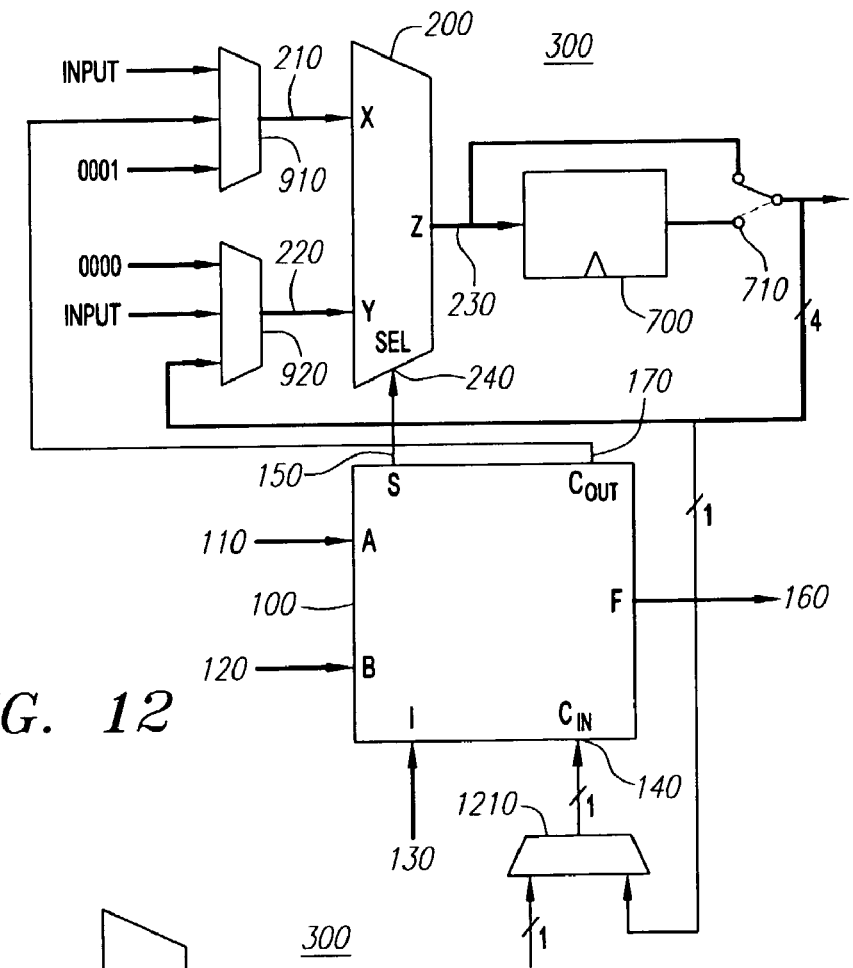
FIG. 12 depicts a cluster with additional elements to implement a registered path from the carry out output to the carry-in input of the ALU.

Turning to FIG. 12, a further useful modification of the circuit of FIG. 11 is to allow one of the bits of the register 700 or multiplexer 200 output to be used as a dedicated carry input to the ALU. A bit from the 4-bit output 230 of the multiplexer 200 is routed to an input multiplexer 1210 connected to the carry-in input 140 of the ALU 100. This creates a registered path from the carry out output 150 to the carry-in input 140. Such a path is useful when creating serialized arithmetic circuits, especially when combined with the ability to reset the register 700 as discussed above.

Figure 10:
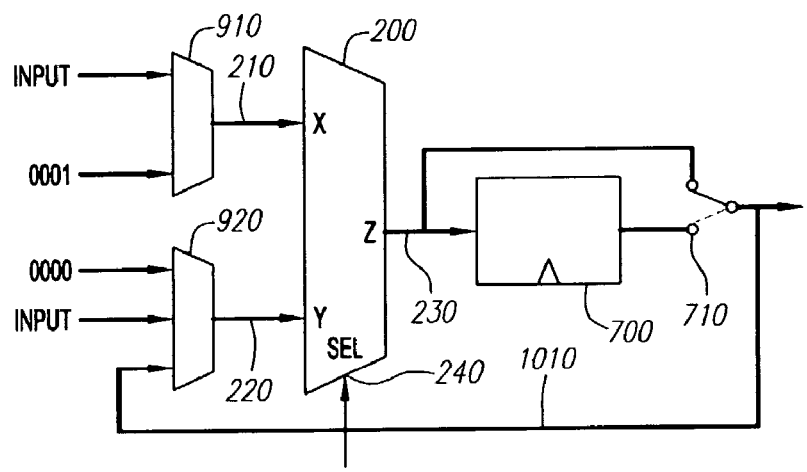
FIG. 10 depicts a multiplexer with input selection logic configured as a feedback circuit.

FIGS. 10-12 show the feedback path to the second input multiplexer 920 being connected to the output of the switch 710. Alternatively, the feedback path could be connected to the output of the register 700, before the switch 710. However, making the connection after the switch 710 makes it possible to choose the unregistered path, and thereby construct an asynchronous latch.

Figure 13:
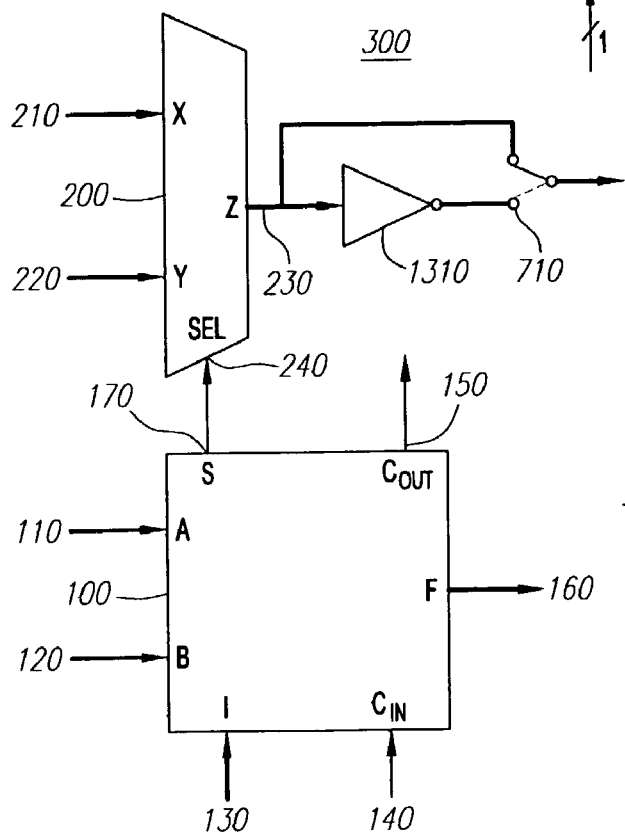
FIG. 13 depicts a cluster with an inverter connected to the multiplexer output.

Turning to FIG. 13, yet another extension of the basic circuit of the cluster 300 is shown. By adding an inverter 1310 to the output 230 of the multiplexer 200, the range of functions generateable by the multiplexer 200 is increased. It is possible for the multiplexer 200 to provide NAND and NOR gates:

NAND(A, B)=NOT (A?B:0)
NOR(A, B)=NOT (A?1:B).

Additionally, this provides an alternative way to implement output inversion:

NOT A=A?0:1—this form doesn't use an inverter
NOT A=NOT(1?A:0)—this form uses an inverter.

The latter option connects the A signal to a data input 210, 220 of the multiplexer 200 rather than to the select input 240. This may be preferable if there are different routing delays to the data inputs 210, 220 and the select input 240.

Additionally, an alternate way to do functions with one input inverted is provided:

A & (NOT B)=B?0:A—this form does not use an inverter $$A\ \&(\text{NOT}\ B) = \text{NOT}((\text{NOT}\ A)\ \text{OR}\ B)$$
$$= \text{NOT}(A\,?\,B\!:\,1).$$

Again, this provides increased flexibility as to which multiplexer inputs to use to implement the function.

The circuits discussed above are merely examples of the wide variety of circuits that can be implemented using the clusters 300 of an embodiment of the invention.

Heterogeneous arrays including the clusters 300 discussed above are able to implement many circuits smaller and faster than homogeneous arrays purely of ALUs. Multiplexers are significantly smaller and faster than ALUs, and therefore circuits that can make use of multiplexers are smaller and faster than equivalent circuits made up purely of ALUs. Operations such as condition processing, data formatting and instruction selection are all implemented more efficiently with a mix of multiplexers and ALUs than they would be with ALUs alone.

Speed is further improved by use of an array with a heterogeneous interconnect. A first general-purpose routing network is provided for routing of data and instructions amongst the elements of the array, and additional interconnect provides a multiplexer control network for routing of select signals between ALUs and multiplexers. This multiplexer control network may be a simple direct connection between an ALU and one or more associated multiplexers within a cluster, or it may be a more complex control network adapted to connect an ALU select output to multiplexers within the same cluster, within other clusters, or both. This control network may take the form of a second general-purpose routing network, separate from the first and optimized for carrying multiplexer control signals rather than data and instructions.

The heterogeneous array of an embodiment significantly reduces problems in determining the proper mixture of element types. Multiplexers are useful to implement a wide variety of application logic components, such as bit-level logic, data reformatting, and dynamic instruction selection. Therefore, most applications that a designer might wish to implement on the heterogeneous array will be able to use multiplexers to some degree.

Multiplexers, however, are not the only way to implement the functions for which they are useful. An ALU can be used to implement any functions that a multiplexer can do. The multiplexer is just usually a more efficient implementation. Therefore, an application can be divided into three types of logic components:

1. That logic which is preferably implemented in ALUs,
2. That logic which is preferably implemented in multiplexers,
3. That logic for which there is a choice of implementation.

Any or all of these categories may have subcategories, indicating a relative level of preference within the category. These subcategories are used to fine-tune the allocation of logic components to processing elements, depending on the specific mix of processing elements provided in the array and the various amounts of logic components in each category.

Figure 14:
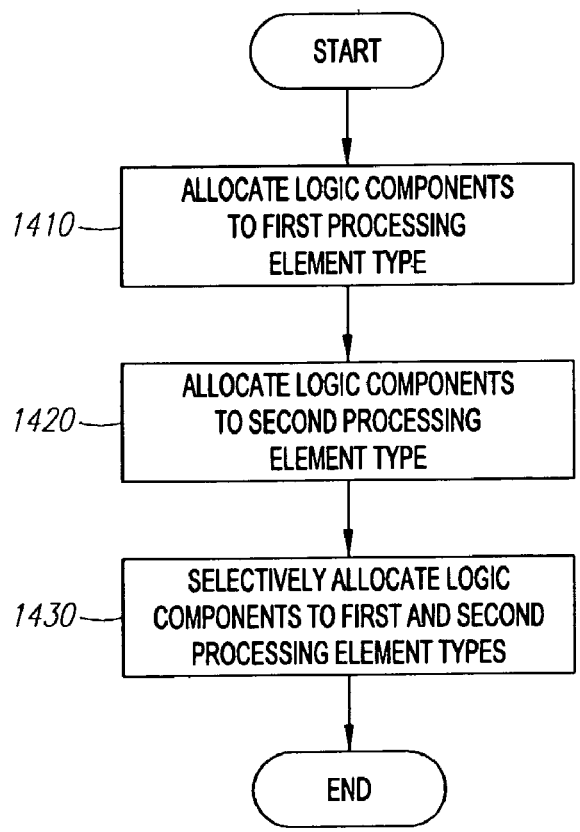
FIG. 14 is a flowchart of a method for assigning application logic components to processing elements.

The existence of the third category means that it is not necessary to find the "perfect" ALU-to-multiplexer ratio that guarantees there are always enough multiplexers (or ALUs) for all applications. Instead, when deciding how to allocate logic components amongst the processing elements, the method of FIG. 14 is used. At step 1410, the logic components which are preferably implemented in the first processing element type are identified and allocated to processing elements of the first type. If there are sub-categories indicative of a relative preference within the category, then the components with the strongest preference are allocated first.

At step 1420, the components which are preferably implemented in the second processing element type are identified and allocated to processing elements of the second type. If there are sub-categories indicative of a relative preference within the category, then the components with the strongest preference are allocated first.

At step 1430 the remaining logic components are allocated between the remaining processing elements of the first and second types according to a heuristic. For example, the remaining logic components are allocated to the second type elements until there are no more second type elements remaining, and then allocated to the first type elements. Alternatively, the remaining elements are split by their sub-category, with those logic components having a relative preference for the second type going to the second type and those logic components having a relative preference for the first type going to the first type.

Select Signal Output

Figure 15:
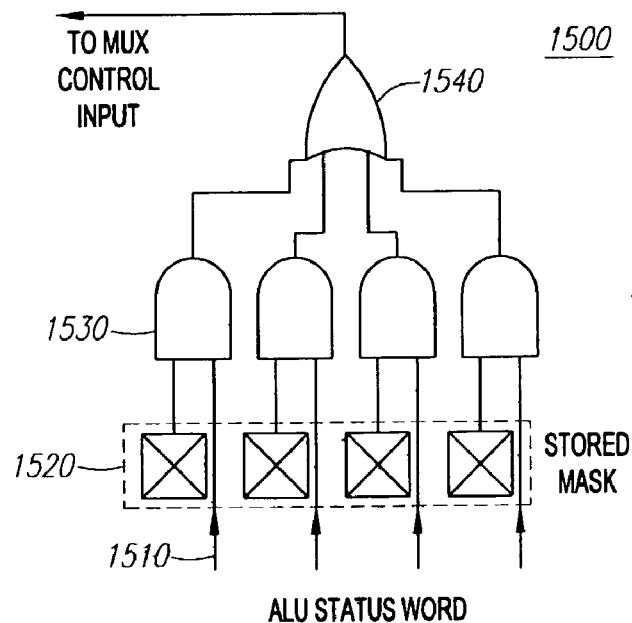
FIG. 15 depicts a circuit for generating and selecting a multiplexer control signal.

As discussed above, the select signal output 170 of the ALU 100 (shown in FIG. 1) can comprise any of a variety of different signals. Turning to FIG. 15, an example of a selection circuit 1500 for generating and selecting a control signal used to control the multiplexer 200 will now be discussed in more detail. The selection circuit 1500 includes a plurality of status inputs 1510 adapted to receive status bits from the ALU 100, together referred to as an ALU status word (ASW). Each of the status inputs 1510 carries a bit indicating a particular status signal, such as Sign, Overflow, Carry-Out, or a bit from the instruction input 130, or any other data useful for controlling the multiplexer 200.

The selection circuit 1500 also includes a plurality of mask inputs 1520, together referred to as a mask word. The mask inputs 1520 are adapted to receive mask values, which are used to mask out one or more of the status bits of the ALU status word. The mask inputs 1520 may receive their mask values from a wide variety of sources. For example, the mask inputs 1520 may be connected to the first general-purpose routing network, and thereby receive mask values dynamically from other processing elements in the array. Alternatively, the mask inputs 1520 may be connected to local memory cells which store mask values, including mask values loaded into the array when it is configured for a particular application.

The status inputs 1510 and the mask inputs 1520 are connected to a plurality of AND gates 1530, which are adapted to perform a bitwise AND on the inputs 1510, 1520. The AND gates 1530 are all connected to an OR gate 1540, which combines the AND'ed values together to form a single bit output provided to the select input 240 of the multiplexer 200, to control the multiplexer 200.

Setting the mask word to all 0's means that the multiplexer control signal sent to the select input 240 will be zero, i.e. the multiplexer 200 will be fixed to always supply the value on the second input 220 to the output 230. If one of the bits of the ASW is a constant 1, then selecting this bit with the mask word means that the control signal will be 1, i.e. the multiplexer 200 will be fixed to always supply the value on the first input 210 to the output 230. In combination with the all 0's case, this provides the ability to set the multiplexer control signal to either constant 0 or constant 1.

Figure 16:
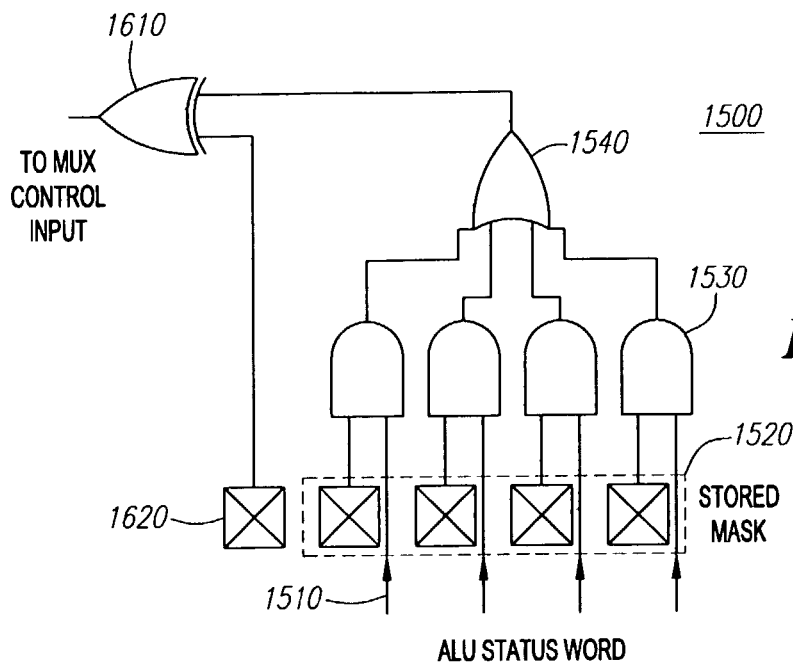
FIG. 16 depicts a circuit for selectively inverting a multiplexer control signal.

An alternative way to allow for both constant 0 and constant 1 is to extend the selection circuit 1500 as shown in FIG. 16. The selection circuit 1500 is extended by placing an XOR gate 1610 on the output of the OR gate 1540, so that the output of the OR gate can be inverted. The other input to the XOR gate 1610 is tied to a data source 1620 which is loaded with a value during configuration of the array. If the value is "1", then the XOR gate 1610 operates as an inverter, inverting the output value from the OR gate 1540. If the value is "0", then the XOR gate 1610 propagates the output of the OR gate 1540. Thus, the XOR gate 1610 functions as an "inverter with enable." This behavior is shown in Table 2:

TABLE 2

| data source value | OR output | XOR Result |
|---|---|---|
| 0 | 0 | 0 |
| 0 | 1 | 1 |
| 1 | 0 | 1 |
| 1 | 1 | 0 |

Thus, if a constant 0 is desired to be sent to the select input 240, the mask word is set to all 0's, and the data source value is set to 0. If a constant 1 is desired to be sent to the select input 240, the mask word is set to all 0's, and the data source value is set to 1. This alternative also allows the output of the OR gate 1540 to be inverted for all values of the mask word.

This means that the polarity of control to the multiplexer 200 can be varied. With the inverter activated, the second input 220 would be selected instead of the first input 210 by a "1" output from the OR gate 1540, and the first input 210 would be selected instead of the second input 220 by a "0" output from the OR gate 1540. This is useful when the multiplexer 200 has asymmetrical connections to the inputs 210, 220 of the multiplexer 200. An example of this is where a feedback path from a register output only connects to one of the inputs 210, 220, or where a dedicated constant input is only available on one of the inputs 210, 220.

Possible Contents of ALU Status Word

The ASW can include, for example, bits representing any or all of the following values:

ALU carry in,
ALU carry out,
ALU "overflow" (using the 2s complement definition of overflow),
ALU "correct sign" (again, following the 2s complement definition),
One or more bits taken directly from an ALU data input 110, 120, or
One or more bits taken directly from the ALU instruction input 130

In one example RAA design, the ALU instruction value can be stored in a register within the ALU, in which case the instruction input 130 is available for use as a dedicated multiplexer control input. This means that the instruction input 130 can be used to cover both the "bits from an instruction input" and the "bits from a data input" in the above list. Consequently, a useful subset of this list includes: carry out, correct sign and 2 bits from the ALU instruction input 130.

This subset means that the multiplexer control signal can be, for example, one of the following:

The result of an unsigned comparison (less than, greater than), via carry out,
The result of a signed comparison (less than, greater than), via the sign signal,
The sign of a signed arithmetic operation, to be used for sign extension (again via sign signal),
An overflow from an unsigned arithmetic operation (again via carry out),
The result of an equality test (for ALU designs that report equality test results via carry out), or
A bit derived from the instruction input 130, with a choice of 2 instruction bits. (Also covers the "bits from a data input" option).

This subset therefore covers some of the commonly tested conditions in applications. Signed arithmetic overflow, which is uncommon in RAA applications (since RAA commonly uses a different approach to wordlength management as discussed in detail below), can be synthesized from the correct sign and the MSB of the arithmetic result.

Possible Choices of Instruction Bits

Among the choices for which bits of the instruction input 130 should be available in the ASW are the following examples:

1. Instruction LSB and MSB.

The LSB is the bit used to propagate carries across the routing network, as it means that carry values have the correct numeric value (1 if there is a carry, 0 if there is not). Being able to connect a carry via the instruction input 130 means that the multiplexer 200 can be controlled by carry from its local ALU 100 and also (indirectly) by carry from any other ALU 100 in the array.

The MSB is selected for a similar reason—it is the sign bit in a word, so being able to choose it gives flexibility over the choice of sign data.

2. Instruction LSB and Instruction bit n/2 (i.e. bit 2 in a 4-bit Word, 3 in a 6-bit Word . . . )

The LSB is selected for the same reasons as choice #1 above.

Choosing a bit in the middle of a word facilitates extracting all the bits from a word individually using the instruction inputs 130 of multiple ALUs 100 together with a series of shifts or rotates. The iterative sequence:

Extract bit 0 and n/2
Rotate 1 place left
Extract bit 0 and n/2 (equivalent to bits n−1 and n/2−1)
Rotate 1 place left Extract bit 0 and n/2 (equivalent to bits n−2 and n/2−2)
Rotate 1 place left
etc.

gives an efficient, regular method to extract all n bits with n/2 rotates. For this to work the bits used to have to be spaced evenly within the instruction word, and since bit 0 is useful for other reasons the other bit will be half a word up from bit 0.

An alternative useful subset for the ASW is a 5-bit word including the 4 bits of the instruction input 130, plus the ALU carry output 150. This subset has the following advantages:

1. Carry out provides unsigned comparison and overflow as described above.
2. Having all bits of the instruction input 130 available makes it possible to control a multiplexer 200 with an arbitrary bit taken from a word. This makes it relatively straightforward to construct arbitrary functions of the bits within a word (especially when combined with the use of multiplexers 200 to construct logic gates, as described above).

The ability to extract any bit from a word also makes it easy to perform sign extension, and therefore to guarantee that signed overflow will not occur.

State Encoding

The use of an n-bit mask to choose which bits of the ALU status word are to be connected to the select input 240 implies that there are $2^n$ possible combinations that may be used. In practice some combinations are much less common than others, and some are never used.

Taking the 4-bit ASW example outlined above, there are 16 possible combinations, as outlined in Table 3 below. The first four columns show the mask values, and the fifth column shows the resulting output function sent to the select input 240.

TABLE 3

| Carry | Sign | Instr_LSB | Instr_MSB | Multiplexer control function |
|---|---|---|---|---|
| 0 | 0 | 0 | 0 | Constant |
| 0 | 0 | 0 | 1 | Instr_MSB |
| 0 | 0 | 1 | 0 | Instr_LSB |
| 0 | 0 | 1 | 1 | Instr_LSB OR Instr_MSB |
| 0 | 1 | 0 | 0 | Sign |
| 0 | 1 | 0 | 1 | Sign OR Instr_MSB |
| 0 | 1 | 1 | 0 | Sign OR Instr_LSB |
| 0 | 1 | 1 | 1 | Sign OR Instr_LSB OR Instr_MSB |
| 1 | 0 | 0 | 0 | Carry |
| 1 | 0 | 0 | 1 | Carry OR Instr_MSB |
| 1 | 0 | 1 | 0 | Carry OR Instr_LSB |
| 1 | 0 | 1 | 1 | Carry OR Instr_LSB OR Instr_MSB |
| 1 | 1 | 0 | 0 | Carry OR Sign |
| 1 | 1 | 0 | 1 | Carry OR Sign OR Instr_MSB |
| 1 | 1 | 1 | 0 | Carry OR Sign OR Instr_LSB |
| 1 | 1 | 1 | 1 | Carry OR Sign OR Instr_LSB OR Instr_MSB |

The lines with both instruction bits used are very uncommon, and the lines with both Carry and Sign used never occur in practice. Carry OR Sign is not a control function that occurs in normal applications (because Sign already includes an XOR with Carry). Furthermore, the use of the two instruction bits is not equally likely—the LSB is more commonly used than the MSB, especially in the combinations of instruction and Carry or Sign.

It would therefore be possible to identify a "commonly used" subset of this table which could be encoded in fewer bits, with a more complex logic circuit to combine mask and ASW. For example, the 8 more common states in the table could be encoded in 3 bits. However, the required decoding would be significantly more complex. An alternative is to retain the 4-bit encoding for ease of decoding the common states, and use the uncommon states to encode alternative useful functions, an example of which is described below.

High-fanout Control Signals

Many applications contain a small number of control signals that are widely used throughout the application. For example:

"Global Reset,"
"Global enable," or
Pipeline stall/enable.

These signals commonly connect to registers, either to their reset or enable inputs, and are therefore the kind of signals that would be expected to connect to the multiplexer select inputs 240 of the multiplexers 200 in an RAA.

These signals are also poorly supported by the general-purpose routing networks in conventional reconfigurable devices. These networks are normally optimized to handle the routing patterns typical of data flow in the applications, which typically have fanouts much lower than those of these global control signals. "Fanout" is the number of inputs of other processing elements that a given output drives. The mean fanout in a reconfigurable device constructed from n-input processing elements is <=n. (Since all inputs are driven either by outputs or by constants). For FPGAs and RAAs n is typically <=4, while high-fanout signals could easily have fanouts many times greater. Some devices add dedicated high-fanout connections to their routing networks for broadcasting a few high-fanout signals rapidly over long distances across the array. However, these dedicated connections still need to be connected to the clusters 300 in an effective manner. An alternative way to support these high-fanout signals is to add a second general-purpose routing network, able to connect efficiently to the multiplexer select inputs 240. This alternative is discussed further below.

The circuit 1500 discussed above can be extended to include efficient connections to various networks, (such as the second general-purpose routing network mentioned above) and can do so by making use of the uncommon parts of the ASW encoding scheme described above.

Figure 17:
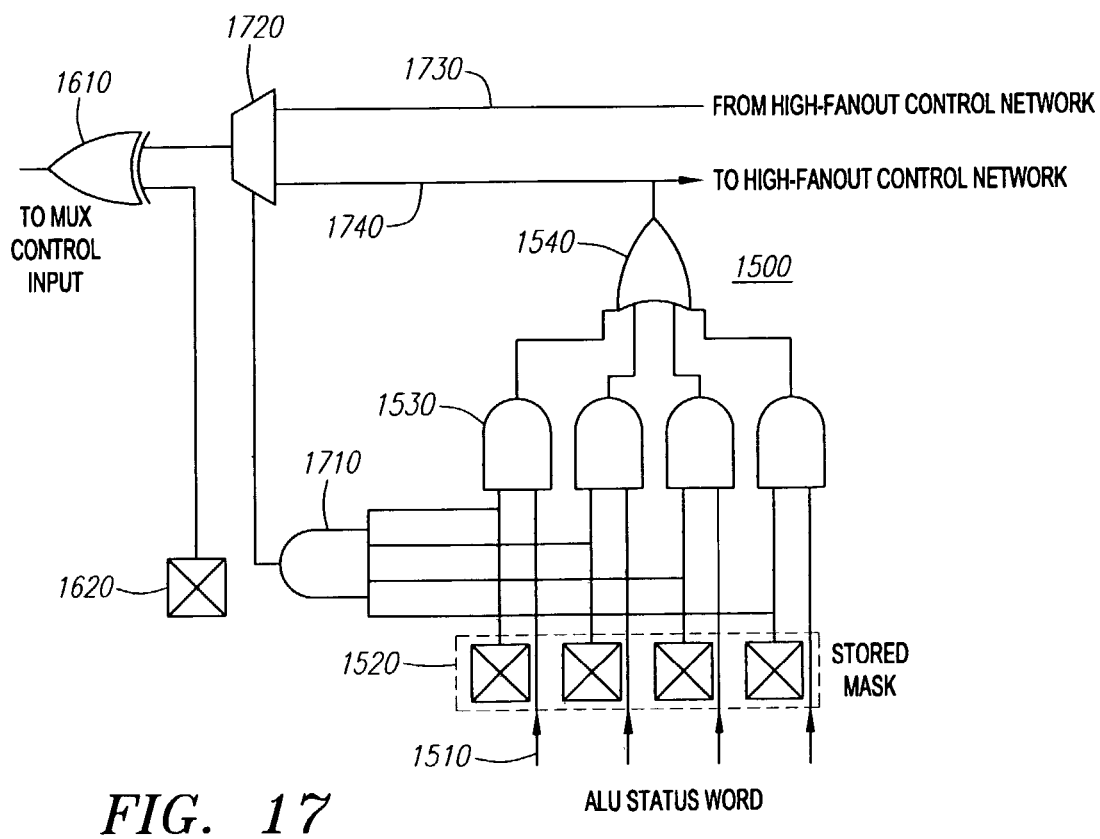
FIG. 17 depicts an extension to the circuit of FIG. 15, which allows a value to be diverted to control extended circuitry.

The "All mask bits set" state can be used to select an alternative input to the multiplexer control path, as shown in FIG. 17. The circuit 1500 as extended includes a 4-input AND gate 1710, which draws its inputs from the mask inputs 1520. The output of the 4-input AND gate 1710 is connected to the select input of a multiplexer 1720. The multiplexer 1720 receives a first input 1730 from the high-fanout network, and a second input 1740 from the circuit 1500. The multiplexer 1720 provides an output to the XOR gate 1610, to convey a select signal to the select input 240 of the multiplexer 200 as discussed above.

When the mask inputs 1520 are configured to all 1's (the final row of Table 3), this causes the output of the 4-input AND gate 1710 to go high (1), which causes the multiplexer 1720 to select the first input 1730, from the high-fanout network, to provide the select signal to the multiplexer 200, via the XOR gate 1610. Thus, the multiplexer 200 is controlled by a signal routed across the high-fanout network.

When the mask inputs 1520 are configured to any other value, the output of the 4-input AND gate 1710 stays low (0), causing the multiplexer 1720 to select the second input 1740, from the circuit 1500, to provide the select signal to the multiplexer 200, via the XOR gate 1610. Thus the multiplexer 200 is controlled by the ALU 100, as discussed above.

The ASW processing logic such as the circuit 1500, optionally extended as discussed, is also a useful source of high-fanout control signals to be provided to the high-fanout control network. "Global" control signals are typically derived in a similar way to "local" control signals, they are just provided to a larger part of the array. Therefore, the output of the circuit 1500 is also routed to the high-fanout control network. The output may be routed directly to the high-fanout control network as shown in FIG. 17, or alternatively the output can be routed first through the multiplexer 1720, with the connection to the high-fanout network being made to the output of the multiplexer 1720. This alternative connection allows the high-fanout output to be derived from the high-fanout input instead.

Variants of this circuit are possible which decode multiple "uncommon" states from the ASW selection table (Table 3) and choose between multiple inputs from the high-fanout network. Alternatively these multiple uncommon states can be used to select a state to drive the high-fanout output.

There are several ways in which the high-fanout output can be connected to the high-fanout network. A useful way is to make the connection via a tri-state buffer, with the tri-state enable driven by part of the configuration state of the device (e.g. a dedicated configuration bit). This form of connection has the advantage that multiple sources are capable of driving the high fanout wire, but the timing is independent of which one is actually used. This makes the timing of the high fanout network easy for routing software to analyze.

High-fanout Control Network

The above section describes the usefulness of high-fanout control signals, and an example of how they could be interfaced to the multiplexer control circuit 1500. This section provides an example of a useful connection pattern for the high-fanout connection wires to use, to create a general purpose routing network.

It is assumed that the processing elements in a reconfigurable array are arranged in rows and columns on an X-Y grid, either a fully populated grid or a partially populated one (e.g. a checkerboard or chessboard arrangement). On such an array it is likely that those elements sharing a common multiplexer control signal can be arranged in:

Rows, or

Columns, or

Approximately rectangular patches.

(based on the assumption that the high-fanout control signal is being used to control a datapath that has a bitslice (or sub-word-slice) style layout).

These patterns are all variants of a basically rectangular structure. Therefore it is useful for the high-fanout wires to be able to efficiently construct these patterns. The following is an example of a high-fanout network which constructs such patterns:

1. The array contains high fanout wires in both the horizontal and vertical directions.

2. Each individual high fanout wire runs either horizontally or vertically (i.e. along a row or a column), and connects to all the ALUs 100 that it crosses. The wires may run along the whole row (column) or just part of it.

3. The high fanout wires connect to the multiplexer control circuits 1500 as indicated above, with the following additional constraints:

If there is more than one multiplexer 200 per ALU 100, then each circuit 1500 has its input from and output to the high-fanout wires connected to orthogonal wires (i.e. input from vertical, output to horizontal or vice versa).

If there is only 1 multiplexer 200 per ALU 100 then the circuit 1500 should be capable of connecting the inputs and outputs from/to the high-fanout network to both horizontal and vertical high-fanout wires.

The wires naturally run in horizontal and vertical directions, so it is easy to make row and column connections as described above. Furthermore, the ability to input from a horizontal wire and output to a vertical one (or vice versa) makes it possible to create 2-dimensional patches—a horizontal wire can be connected to several vertical wires that it crosses.

In the situation where wires do not run across the whole array their ends should be staggered—i.e. the ends of parallel wires in adjacent columns (and rows) should not be coincident but should be offset from each other. Consider the case of control wires that span 4 ALUs 100 ("Length 4" wires in the normal RAA terminology). In column 0 these wires can run from ALU 0 to ALU 3, ALU4 to ALU 7 etc, while in column 1 they can run from ALU 2 to ALU 5, ALU 6 to ALU 9 etc. Because the spans of these wires overlap they can be connected by a horizontal control wire so that the total vertical reach of 2 wires is greater than that of a single wire on its own.

Figure 20:
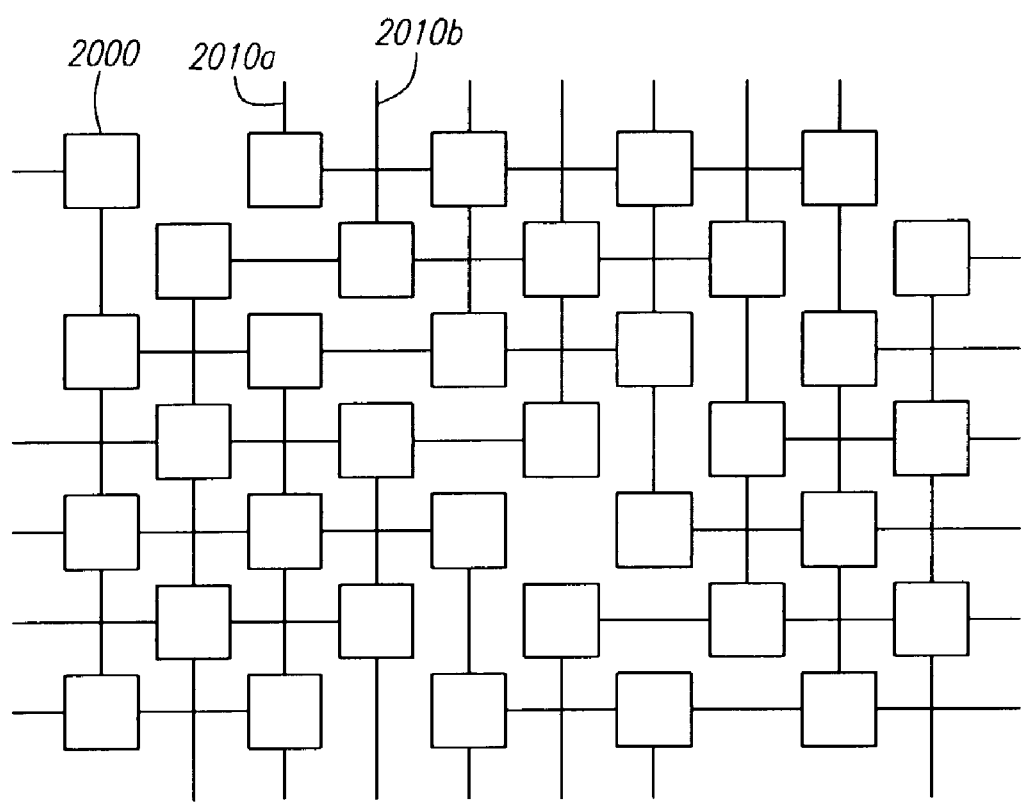
FIG. 20 depicts a reconfigurable array including two general purpose routing networks for control signals.

A checkerboard arrangement, such as shown in FIG. 20, has the property that there are no ALUs in an even row but an odd column (or vice versa)—those sites are occupied by the spaces between ALUs, or more commonly by hardware to support the routing network. The connection pattern described above results in the creation of two independent control networks 2010*a* and 2010*b*—one linking the ALUs 2000 in odd numbered rows and columns, and the other linking the ALUs 2000 in even numbered rows and columns. In FIG. 20, the lines between ALUs 2000 depict the control network connections. Lines crossing within an ALU 2000 are connectable to each other to form a control network 2010*a*, 2010*b*. Lines crossing outside of the ALUs 2000 are not connectable to each other to form control networks 2010*a*, 2010*b*. This may be an acceptable situation, with the two networks used to distribute two separate control signals, Alternatively it may be found to be useful to provide connections between these two networks 2010*a*, 2010*b*. The points at which they cross will lie over the routing regions of the checkerboard, so it is easy to support this connection if required.

The general-purpose routing networks 2010*a*, 2010*b* are separate from the first general-purpose routing network described above. A signal can only propagate from 2010*a*, 2010*b* to the first general-purpose routing network by controlling a multiplexer in the manner described in connection with FIG. 4B above.

The Usefulness of "Sign" and "Overflow" as Control Signals

"Sign" is especially useful as a control signal for an FPGA- or RAA-based reconfigurable array. This is a difference between such arrays and traditional processors, which tend to use overflow. The reasons for this are set out below.

Overflow

Processors have very limited control over wordlength, typically only supporting a small range of wordlengths (e.g. 8, 16 and 32 bits—a range of powers of 2 is common). FPGA and RAA devices can support a wide range of wordlengths, limited only by the granularity of the processing elements that make up the array (i.e. if the array has 4-bit processing elements then it can directly handle wordlengths equal to 4n (positive integer n)).

Many arithmetic applications have the property that when run with "typical" data sets all intermediate data calculated within the application will fit in a particular wordlength, but there are some uncommon data sets whose intermediate results do not fit. This is a significant issue for a processor when the typical case fits into one of the supported wordlengths but the uncommon case does not. A simple processor based implementation is then faced with an unfortunate choice:

always run with a wordlength large enough to handle the rare cases, and accept the efficiency penalty to do this, or
run with the smaller wordlength, and accept that the results may occasionally be wrong.

The efficiency penalty can be quite significant—e.g. changing from a 16-bit to a 32-bit implementation can double the amount of memory required for intermediate results and halve the throughput of the main datapath. However the possibility of occasional errors may be unacceptable.

Fortunately there is a third option that can be used to avoid having to make this choice:

in normal circumstances run with the smaller wordlength, but detect the situations where this gives the wrong answer so that remedial action can be taken if required. (e.g. rerun all or part of the calculation with a wider wordlength).

This allows the application to have the benefits of the small wordlength (memory size, datapath throughput) most of the time, and only pay the penalty of the long wordlength version on those rare occasions where it is necessary.

Most processors therefore have an overflow detection mechanism that identifies when the result of a calculation doesn't fit in the target wordlength, and can branch to another part of the program when an overflow happens. "Overflow" is therefore an important concept for processors.

For FPGA- and RAA-based processing, the situation is significantly different—the cost of extending the wordlength is significantly lower because of the finer-grain control of wordlength, and the cost of branching is significantly higher. Suppose the application normally fits in 16 bit words, but occasionally requires 18 bits. A processor would have to use 32 bit words to handle these cases, but an RAA with 4-bit processing elements could use a 20-bit datapath. The penalty for supporting the worst-case situation is therefore a 25% area increase, not a 100% increase.

As described above, FPGA and RAA commonly implement branching by building datapaths for all possible paths through a program. They then use multiplexers to select the correct path for a particular data set. Having a 16-bit primary datapath with some sections repeated using 20 bits, plus multiplexing to choose between them can quickly result in a larger implementation than simply using a wider datapath throughout.

In summary, processors are bad at fine-grain wordlength control but good at branching, while FPGA and RAA are better at wordlength control, and worse at branching. Overflow detection is a way of converting wordlength problems into branches, and is therefore appropriate for processors, but not for FPGA or RAA.

Sign

Knowing the sign of a result is important for two specific operations within applications:

Comparison:
A>B can be implemented by subtracting A from B and checking the sign of the result (only the sign of the result is important, not the full value). Similar methods work for other comparisons (<, <=, >=).

Sign Extension:
When increasing the wordlength of a 2s complement signed number, the sign bit needs to be copied into all the added bits. This is normally a simple operation once the sign bit is known.

Correct results must be obtained for both signed and unsigned numbers. The "unsigned" case can be viewed as a special case of signed operations (with the n-bit unsigned values embedded in n+1-bit signed values). In 2s complement notation, the value −X is expressed as (NOT X)+1, with a 1 in the most significant bit ("MSB"), representing the sign bit. Thus:

$-2_{decimal} = \text{NOT}(010_{binary}) + 1_{binary} = 101_{binary} + 1_{binary} = 110_{binary}$.

Unsigned comparison will always be correctly expressed by the carry out from the most significant bit of the calculation.

Signed comparison by subtraction and testing the carry out from the MSB will give the wrong result in the event of an arithmetic overflow. This can be fixed with a combination of "Carry out" and "Overflow" signals, or by directly generating the sign signal.

Unsigned "sign extension" is trivial—all the added bits are 0.

Signed sign extension is as described above—the sign is copied into all the added bits.

The different implementations of wordlength control and branching in processors, FPGA and RAA described above also have an impact on how signs are computed and used.

Processors

Processors use branching as their main control mechanism, and they use comparisons to control branching. This is done either with a combined "compare and branch" instruction or with separate "compare and set flag" and "branch if flag set" instructions. There is therefore some similarity between comparison operations and the description of overflow handling above—they both have a "do an operation" stage followed by a "branch if some condition occurs". (i.e. if there is an overflow, or if the comparison was true) This similarity is often made explicit, with the processor having a set of "condition flags" that indicate which of a set of interesting conditions have occurred (such as arithmetic overflow, calculation produced a negative result (i.e. "sign"), most recent carry out value), and a generic branch instruction that jumps if one or more of a specified subset of the flags are set.

Sign extension normally takes place as data is loaded into the processor from memory. If the data is stored in a format that is more compact than the format into which it is being loaded, then sign extension is an option on the load operation, replicating the MSB of the stored representation into the extra bits of the in-processor version.

FPGA

Branching is an inefficient operation in an FPGA. Comparison operations in an FPGA are more likely to be used as control inputs to multiplexers, or blocks of logic to combine multiple conditions. Computation of sign is a straightforward operation, as the 1-bit nature of the routing network makes it easy to directly implement the expressions for the correct sign given below.

Sign extension in an FPGA can be a routing operation—the 1-bit nature of FPGA routing allows a sign bit to be easily connected to multiple destinations. However, there is often no need to extend the inputs to an arithmetic operation as it is easy to implement operators with n-bit inputs and n+1-bit outputs.

RAA

RAA is an intermediate case between processors and FPGAs—generic branching is still inefficient (although some limited forms can be implemented by multiplexing of instructions) but the routing network is word-based rather than bit-based, so a direct implementation of the expressions for sign and overflow is more complex, requiring shifts to adjust the positions of bits within the words. It is therefore worth considering adding extra logic to the RAA ALU to directly generate Sign and/or Overflow. For example, Sign is useful, and requires just 1 XOR gate to implement it.

Sign extension cannot be a simple routing option, due to the need to realign bits within words. However, sign extension of arithmetic outputs (as described in the FPGA case above) can also be used with RAA, and benefits directly from the availability of a sign signal. The circuit of FIG. 18—with the sign output 1810 of an addition (or subtraction) operation 1820 controlling a multiplexer 1830—maps directly onto the ALU 100 and multiplexer 200 of the cluster 300 shown in FIG. 3. It is identical to the circuit structure used for data selection following a signed comparison illustrated in FIG. 4A. The circuit receives as inputs two numbers to be added or subtracted, and generates as output the result of the operation and an additional number of bits that pad the output to the desired length, by extending the sign value.

Figure 18:
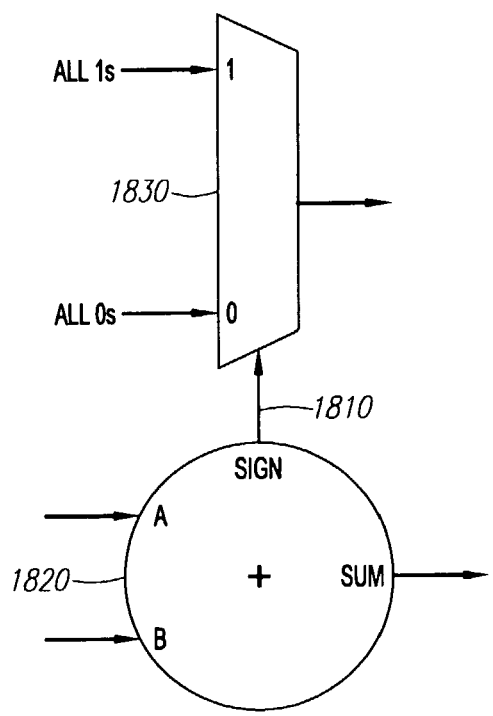
FIG. 18 depicts a circuit implementing sign extensions, which can be mapped onto the cluster of FIG. 3.

In the circuit of FIG. 18, if the sign output 1810 carries a value of "1", indicating a negative number, then the multiplexer 1830 selects the first input value of all 1's to pad the result. If the sign output 1810 carries a value of "0", indicating a positive number, then the multiplexer 1830 selects the second input value of all 0's to pad the result.

In summary, dedicated sign logic is of little benefit to an FPGA as it can directly implement the required logic. It is of much greater benefit to processors (as a control flag for a branch) and to RAA as a control signal for multiplexers 200 where it can be used for both conditional control and sign extension.

Derivation of Expressions for Sign and Overflow

For an individual bit in an addition, the sum and carry out are related to the inputs (A, B, Carry in) as follows (the same formulae work for subtraction if B is replaced with NOT B):

$\Sigma_i = A_i \char`\^ B_i \char`\^ C_{i-1}$ $C_i = \text{if}(A_i \char`\^ B_i) \text{then}(C_{i-1}) \text{else}(A_i)$ Where $C_{i-1}$ is the carry in and $C_i$ the carry out, and $\char`\^$ represents an XOR operation.

An overflow has happened if the result of a calculation with n bits differs from the result which would have been obtained if the calculation had been done with greater precision, e.g. if the inputs and output were extended to n+1 bits. The signed and unsigned cases are to be treated separately:

Unsigned Case

Input extension is achieved by adding leading 0s, $\Sigma_{n-1} = A_{n-1} \char`\^ B_{n-1} \char`\^ C_{n-2}$ $C_{n-1} = \text{if}(A_{n-1} \char`\^ B_{n-1}) \text{then}(C_{n-2}) \text{else}(A_{n-1})$ $\Sigma_n = A_n \char`\^ B_n \char`\^ C_{n-1}$ $A_n = 0$ $B_n = 0$ $\Sigma_n = C_{n-1}$ With an unsigned addition the extra bit in the result should be 0, so there is an overflow if carry out from the n-bit calculation is non-zero. For the subtract case (i.e. replacing B with not B), we have $\Sigma_n = \overline{C}_{n-1}$ and the expected value is again 0. Overflow is therefore either carry out for addition or NOT (carry out) for subtraction.

The correct sign is always positive for unsigned addition. For subtraction, a negative result will cause an overflow, so for subtraction: correct sign=overflow=not carry out.

Signed Case

Input extension is achieved by repeating the MSB.

$\Sigma_{n-1} = A_{n-1} \char`\^ B_{n-1} \char`\^ C_{n-2}$ $C_{n-1} = \text{if}(A_{n-1} \char`\^ B_{n-1}) \text{then}(C_{n-2}) \text{else}(A_{n-1})$ $\Sigma_n = A_n \char`\^ B_n \char`\^ C_{n-1}$ $A_n = A_{n-1}$ $B_n = B_{n-1}$ $\Sigma_n = A_{n-1} \char`\^ B_{n-1} \char`\^ C_{n-1}$ The expected value of the extra output bit is that it too should repeat the MSB of the original calculation. Overflow, V, is therefore equal to the XOR of these two bits:

$$V = \Sigma_n \char`\^ \Sigma_{n-1}$$
$$= (A_{n-1} \char`\^ B_{n-1} \char`\^ C_{n-1}) \char`\^ (A_{n-1} \char`\^ B_{n-1} \char`\^ C_{n-2})$$
$$= (A_{n-1} \char`\^ A_{n-1}) \char`\^ (B_{n-1} \char`\^ B_{n-1}) \char`\^ (C_{n-1} \char`\^ C_{n-2})$$
$$= 0 \char`\^ 0 \char`\^ (C_{n-1} \char`\^ C_{n-2})$$
$$= C_{n-1} \char`\^ C_{n-2}$$

So the overflow signal can be generated with a single XOR gate combining carry in and carry out of the last stage of the n-bit calculation.

The correct sign, (often referred to as the negative flag, N) is equal to the extra output bit:

$$N = \Sigma_n$$
$$= A_{n-1} \char`\^ B_{n-1} \char`\^ C_{n-1}$$

But the $A_{n-1} \char`\^ B_{n-1}$ term is already calculated as part of the calculation of the MSB of the n-bit value, so the sign also requires just 1 extra XOR gate to evaluate it.

In summary, for the unsigned case, correct sign and overflow have direct relationships to the carry output. For the signed case this is no longer true, but both sign and overflow require the addition of just 1 extra XOR gate each to generate them correctly.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense, and the invention is not to be restricted or limited except in accordance with the following claims and their legal equivalents.

I claim:

1. A heterogeneous reconfigurable array, comprising:
a general-purpose routing network,
a plurality of clusters connected to the general-purpose routing network, each cluster comprising a plurality of processing elements, each plurality of processing elements comprising:
a first processing element, and
a second processing element;
wherein the first processing element is of a first type and the second processing element is of a second type;
wherein the first processing element comprises a first input, a second input, a first output and a second output;
wherein the first input and first output are adapted to be connected to the general-purpose routing network without passing through any processing elements;
wherein the second output is adapted to be connected to the second processing element without connecting to the general-purpose routing network;
wherein the second processing element comprises a third input, a fourth input and a third output; and
wherein the third input and third output are adapted to be connected to the general-purpose routing network without passing through any processing elements.

2. The heterogeneous reconfigurable array of claim 1, wherein the first processing element is adapted to be configured for use either combined with the second processing element or independent of the second processing element; and
wherein the second processing element is adapted to be configured for use either combined with the first processing element or independent of the first processing element.

3. The heterogeneous reconfigurable array of claim 1, wherein the first processing element is adapted to be configured such that:
a first connection is made between the general-purpose routing network and the first input without passing through any other processing elements,
a second connection is made between the general-purpose routing network and the first output without passing through any other processing elements, and
a third connection is made between the second output and an input of the second processing element, the third connection being independent of the general-purpose routing network.

4. The heterogeneous reconfigurable array of claim 1, wherein the second processing element is adapted to be configured such that:
a fourth connection is made between the general-purpose routing network and the third input without passing through any other processing elements,
a fifth connection is made between the general-purpose routing network and the third output without passing through any other processing elements, and
a sixth connection is made between the fourth input and an output of the first processing element, the sixth connection being independent of the general-purpose routing network.

5. The heterogeneous reconfigurable array of claim 1, wherein the general-purpose routing network comprises a plurality of first busses each comprising a first bit width;
wherein the first bit width is greater than one;
wherein the second output comprises a second bus comprising a second bit width; and
wherein the second bit width is not equal to the first bit width.

6. The heterogeneous reconfigurable array of claim 5, wherein the second bit width is one.

7. The heterogeneous reconfigurable array of claim 1, wherein the general-purpose routing network comprises a plurality of first busses each comprising a first bit width;
wherein the first bit width is greater than one;
wherein the fourth input comprises a second bus comprising a second bit width; and
wherein the second bit width is not equal to the first bit width.

8. The heterogeneous reconfigurable array of claim 7, wherein the second bit width is one.

9. The heterogeneous reconfigurable array of claim 1, wherein the first processing element comprises an arithmetic logic unit ("ALU").

10. The heterogeneous reconfigurable array of claim 9, wherein the ALU is adapted to process a data word of a first bit width.

11. The heterogeneous reconfigurable array of claim 9, wherein the first input comprises an ALU data input, the second input comprises an ALU instruction input, and the second output comprises an ALU output, wherein the ALU output is adapted to transmit an output signal derived from one or more input signals received by one or more of the ALU data or ALU instruction inputs.

12. The heterogeneous reconfigurable array of claim 11, wherein the output signal is adapted to be derived from an input signal received by the ALU data input.

13. The heterogeneous reconfigurable array of claim 11, wherein the output signal is adapted to be derived from an input signal received by the ALU instruction input.

14. The heterogeneous reconfigurable array of claim 11, wherein the output signal is adapted to be derived from a logical combination of input signals received by the ALU data and ALU instruction inputs.

15. The heterogeneous reconfigurable array of claim 11, wherein the output signal comprises an ALU carry out signal.

16. The heterogeneous reconfigurable array of claim 11, wherein the output signal comprises a sign bit generated by the ALU, the sign bit being equal to the correct sign of a signed arithmetic operation.

17. The heterogeneous reconfigurable array of claim 11, wherein the output signal comprises a match signal that indicates equality of a first ALU data value and a second ALU data value.

18. The heterogeneous reconfigurable array of claim 11, wherein the output signal comprises a match signal that indicates inequality of a first ALU data value and a second ALU data value.

19. The heterogeneous reconfigurable array of claim 11, wherein the output signal comprises an ALU instruction bit received by the ALU instruction input.

20. The heterogeneous reconfigurable array of claim 1, wherein the second processing element comprises a multiplexer, the third input comprises a multiplexer input, the fourth input comprises a select input and the third output comprises a multiplexer output.

21. The heterogeneous reconfigurable array of claim 20, wherein the select input is adapted to be connected to the first processing element without using the general-purpose routing network.

22. The heterogeneous reconfigurable array of claim 20, wherein the multiplexer output is connected to an inverter.

23. The heterogeneous reconfigurable array of claim 20, wherein the multiplexer is adapted to process a data word of a first bit width, wherein the first bit width is greater than one.

24. The heterogeneous reconfigurable array of claim 1, wherein at least one of the plurality of processing elements further comprises a register.

25. The heterogeneous reconfigurable array of claim 24, wherein each of the plurality of processing elements further comprises a register.

26. The heterogeneous reconfigurable array of claim 20, wherein the multiplexer input receives a constant value signal.

27. The heterogeneous reconfigurable array of claim 20, wherein the second processing element further comprises a register.

28. The heterogeneous reconfigurable array of claim 27, wherein the multiplexer input is adapted to receive a feedback signal from the register.

29. A heterogeneous reconfigurable array, comprising:
a general-purpose routing network; and
a plurality of clusters;
each cluster comprising an arithmetic logic unit ("ALU") and a multiplexer;
the multiplexer comprising:
a plurality of multiplexer inputs comprising:
a multiplexer select input, and
a first multiplexer input; and
a multiplexer output;
the ALU comprising:
a plurality of ALU inputs, comprising:
a first ALU data input,
a second ALU data input, and
an ALU instruction input; and
an ALU output
wherein the multiplexer select input is adapted to receive a multiplexer select signal generated by the ALU; and
wherein the multiplexer and the ALU are connected to the general-purpose routing network.

30. The heterogeneous reconfigurable array of claim 29, wherein the multiplexer select signal comprises an instruction input signal bit.

31. The heterogeneous reconfigurable array of claim 29, wherein the multiplexer select signal comprises a combinatorial function.

32. The heterogeneous reconfigurable array of claim 31, wherein multiplexer select signal is generated using one or more input signals received on at least one of the first ALU data input, second ALU data input or ALU instruction input.

33. The heterogeneous reconfigurable array of claim 32, wherein at least one of the input signals comprises more than one bit.

34. The heterogeneous reconfigurable array of claim 30, wherein the first ALU input, ALU output, first multiplexer input and multiplexer output are adapted to be connected to the general-purpose routing network.

35. The heterogeneous reconfigurable array of claim 30, wherein one or more of the ALU inputs comprise word-wide inputs and the ALU output comprises a word-wide output, the first multiplexer input comprises a word-wide input and the multiplexer output comprises a word-wide output, and the word-wide inputs and outputs are adapted to be connected to the general-purpose routing network.

36. The heterogeneous reconfigurable array of claim 31, wherein the multiplexer select signal comprises a carry out signal.

37. The heterogeneous reconfigurable array of claim 31, wherein the multiplexer select signal comprises a sign signal.

38. The heterogeneous reconfigurable array of claim 31, wherein the multiplexer select signal comprises an overflow signal.

39. The heterogeneous reconfigurable array of claim 29, wherein the cluster is adapted to be configured into a data selection circuit.

40. The heterogeneous reconfigurable array of claim 29, wherein the cluster is adapted to be configured into a condition processing circuit.

41. The heterogeneous reconfigurable array of claim 29, wherein the cluster is adapted to be configured into a datapath control circuit.

42. The heterogeneous reconfigurable array of claim 29, wherein the multiplexer select signal input is adapted to bypass the general-purpose routing network.

43. The heterogeneous reconfigurable array of claim 29, wherein an output signal generated by the ALU and routed through the ALU output is propagated to the general-purpose routing network, and wherein the ALU output is not directly connected to the general-purpose routing network.

44. The heterogeneous reconfigurable array of claim 43, wherein the general-purpose routing network has a first bit width, the first bit width comprising two or more bits, and the output signal has a second bit width, the second bit width comprising one or more bits the first bit width being greater than the second bit width.

45. The heterogeneous reconfigurable array of claim 44, wherein the output signal is converted from the second bit width to the first bit width.

46. The heterogeneous reconfigurable array of claim 43, wherein the output signal is propagated to the general-purpose routing network by being routed through the multiplexer.

47. The heterogeneous reconfigurable array of claim 29, further comprising an output register connected to the multiplexer output.

48. The heterogeneous reconfigurable array of claim 47, wherein the multiplexer output is adapted to be routed through the register.

49. The heterogeneous reconfigurable array of claim 47, wherein the multiplexer and the output register are adapted to be configured into a register with enable circuit.

50. The heterogeneous reconfigurable array of claim 47, wherein the multiplexer and the output register are adapted to be configured into a register with reset circuit.

51. The heterogeneous reconfigurable array of claim 29, further comprising input selection logic connected to one of the plurality of multiplexer inputs.

52. The heterogeneous reconfigurable array of claim 51, wherein the input selection logic comprises a second multiplexer comprising at least one input adapted to receive a constant value.

53. The heterogeneous reconfigurable array of claim 51, further comprising an application configured onto the heterogeneous reconfigurable array wherein the input selection logic is not controlled dynamically by the application.

54. The heterogeneous reconfigurable array of claim 51, wherein the input selection logic is adapted to create a feedback path from the multiplexer output to one of the plurality of multiplexer inputs.

55. The heterogeneous reconfigurable array of claim 51, wherein the input selection logic is adapted to provide a carry out signal from the ALU to the multiplexer.

56. The heterogeneous reconfigurable array of claim 29, wherein the array is adapted to provide a feedback path from the multiplexer output to one of the plurality of ALU inputs.

57. The heterogeneous reconfigurable array of claim 56, wherein the feedback path is provided after an output selection switch connected to the multiplexer output.

58. The heterogeneous reconfigurable array of claim 57, wherein the feedback path creates an asynchronous latch.

59. The heterogeneous reconfigurable array of claim 29, further comprising an inverter connected to the multiplexer output.

60. The heterogeneous reconfigurable array of claim 54, wherein the multiplexer output is adapted to be routed through the inverter.

61. A method of configuring an heterogeneous reconfigurable array, the heterogeneous reconfigurable array comprising a plurality of clusters, each cluster comprising a first processing element and a second processing element, the method comprising:
receiving an application,
selecting a first portion of the application,
selecting a second portion of the application,
selecting a third portion of the application,
implementing the first portion in the plurality of first processing elements,
implementing the second portion in the plurality of second processing elements, and
selectively implementing the third portion in either the plurality of first processing elements, the plurality of second processing elements, or a combination thereof, based upon an availability criterion.

62. The method of claim 61, wherein the first portion comprises an application element adapted to be implemented using a first processing element.

63. The method of claim 61, wherein the second portion comprises an application element adapted to be implemented using a second processing element.

64. The method of claim 61, wherein the third portion comprises an application element adapted to be implemented using either a first processing element or a second processing element.

65. The method of claim 61, wherein the availability criterion provides that the third portion is to be implemented in a more plentifully available processing element.

66. The method of claim 65, wherein the third portion comprises a plurality of application elements, and the availability criterion is evaluated once for each application element.

67. The method of claim 61, wherein the plurality of first processing elements comprise arithmetic logic units.

68. The method of claim 61, wherein the plurality of second processing elements comprise multiplexers.

69. A heterogeneous reconfigurable array comprising:
a plurality of arithmetic logic units ("ALU"), each comprising an ALU output and a plurality of ALU inputs;
a plurality of multiplexers, each comprising a multiplexer control input;
a general-purpose routing network adapted to form connections between selected ones of the plurality of ALUs and plurality of multiplexers, and
a multiplexer control circuit connecting one of the plurality of ALU outputs to one of the plurality of multiplexer control inputs;
wherein the multiplexer control circuit is adapted to derive a multiplexer control signal from one or more ALU output signals.

70. The heterogeneous reconfigurable array of claim 69, wherein the ALU output signal comprises a signal dependent on one or more ALU input signals.

71. The heterogeneous reconfigurable array of claim 70, wherein the ALU output signal comprises an ALU carryout signal.

72. The heterogeneous reconfigurable array of claim 70, wherein the ALU output signal comprises a correct sign signal.

73. The heterogeneous reconfigurable array of claim 70, wherein the ALU output signal comprises an overflow signal.

74. The heterogeneous reconfigurable array of claim 70, wherein the ALU output signal comprises an ALU data input signal.

75. The heterogeneous reconfigurable array of claim 70, wherein the ALU output signal comprises an ALU instruction input signal.

76. The heterogeneous reconfigurable array of claim 70, wherein the ALU output signal comprises a logical combination of an ALU data and an ALU instruction signal.

77. The heterogeneous reconfigurable array of claim 69, wherein the one or more ALU output signals are encoded into an ALU output encoding.

78. The heterogeneous reconfigurable array of claim 69, wherein the multiplexer control circuit is adapted to derive the multiplexer control signal from the one or more ALU output signals and one or more mask values.

79. The heterogeneous reconfigurable array of claim 78, further comprising an external input connected to the multiplexer control circuit, wherein the one or more mask values are used to select the external input for generation of the multiplexer control signal.

80. The heterogeneous reconfigurable array of claim 79, wherein the multiplexer control circuit is one of a plurality of multiplexer control circuits, further comprising a dedicated high-fanout network, wherein the dedicated high-fanout network is connected only to the plurality of multiplexer control circuits.

81. The heterogeneous reconfigurable array of claim 80, wherein the external input is connected from the dedicated high-fanout network to the multiplexer control circuit.

82. The heterogeneous reconfigurable array of claim 80, further comprising a dedicated high-fanout network output connected from the multiplexer control circuit to the dedicated high-fanout network.

83. The heterogeneous reconfigurable array of claim 69, wherein the multiplexer control circuit is one of a plurality of multiplexer control circuits, further comprising a second general purpose routing network, wherein the second general purpose routing network is connected only to the plurality of multiplexer control circuits.

84. The heterogeneous reconfigurable array of claim 83, wherein the external input is connected from the second general purpose routing network to the multiplexer control circuit.

85. The heterogeneous reconfigurable array of claim 83, further comprising an output connection from the multiplexer control circuit to the second general purpose routing network.

86. A reconfigurable array comprising:
a first general purpose routing network comprising a first plurality of input terminals and a first plurality of output terminals;
a second general purpose routing network comprising a second plurality of input terminals and a second plurality of output terminals;
wherein the first general purpose routing network has a first bit width and the second general purpose routing network has a second bit width, the first bit width being different from the second bit width; and
a plurality of processing elements, each adapted to be connected to at least one terminal belonging to either the first plurality of input terminals, the first plurality of output terminals, the second plurality of input terminals, or the second plurality of output terminals.

87. The reconfigurable array of claim 86, wherein the first general purpose routing network is connected to the second general purpose routing network only by one or more of the plurality of processing elements.

88. The reconfigurable array of claim 86, wherein the first general purpose routing network can be configured to create a connection between any of the first plurality of input terminals and the first plurality of output terminals.

89. The reconfigurable array of claim 86, wherein the second general purpose routing network can be configured to create a connection between any of the second plurality of input terminals and the second plurality of output terminals.

* * * * *